United States Patent
George et al.

(10) Patent No.: US 11,664,446 B2
(45) Date of Patent: May 30, 2023

(54) SINGLE ELECTRON TRANSISTORS (SETS) AND SET-BASED QUBIT-DETECTOR ARRANGEMENTS

(71) Applicant: Intel Corporation, Santa Clara, CA (US)

(72) Inventors: Hubert C. George, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/468,090

(22) Filed: Sep. 7, 2021

(65) Prior Publication Data

US 2021/0408271 A1 Dec. 30, 2021

Related U.S. Application Data

(63) Continuation of application No. 16/329,706, filed as application No. PCT/US2016/054613 on Sep. 30, 2016, now Pat. No. 11,164,966.

(51) Int. Cl.
*B82Y 10/00* (2011.01)
*H01L 29/76* (2006.01)
(Continued)

(52) U.S. Cl.
CPC ...... *H01L 29/7613* (2013.01); *H01L 29/0665* (2013.01); *H01L 29/4236* (2013.01);
(Continued)

(58) Field of Classification Search
CPC ........... H01L 29/0665; H01L 29/42356; H01L 29/4236; H01L 29/66439; H01L 29/7613;
(Continued)

(56) References Cited

U.S. PATENT DOCUMENTS

| 5,665,979 A | 9/1997 | Takahashi et al. | |
| 6,455,872 B1 * | 9/2002 | Williams | B82Y 10/00 257/14 |

(Continued)

FOREIGN PATENT DOCUMENTS

| CN | 101123272 A | 2/2008 |
| CN | 101069286 B | 10/2010 |
| KR | 20090028358 A | 3/2009 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
(Continued)

*Primary Examiner* — Meiya Li
(74) *Attorney, Agent, or Firm* — Akona IP PC

(57) ABSTRACT

Disclosed herein are single electron transistor (SET) devices, and related methods and devices. In some embodiments, a SET device may include: first and second source/drain (S/D) electrodes; a plurality of islands, disposed between the first and second S/D electrodes; and dielectric material disposed between adjacent ones of the islands, between the first S/D electrode and an adjacent one of the islands, and between the second S/D electrode and an adjacent one of the islands.

20 Claims, 37 Drawing Sheets

(51) Int. Cl.
 *H01L 29/66* (2006.01)
 *H01L 29/06* (2006.01)
 *H01L 29/423* (2006.01)
(52) U.S. Cl.
 CPC .. *H01L 29/42356* (2013.01); *H01L 29/66439* (2013.01); *B82Y 10/00* (2013.01)
(58) Field of Classification Search
 CPC . H01L 29/0649; H01L 29/127; H01L 29/417; H01L 29/423
 See application file for complete search history.

(56) References Cited

U.S. PATENT DOCUMENTS

| | | |
|---|---|---|
| 2002/0179897 A1 | 12/2002 | Eriksson et al. |
| 2005/0040389 A1 | 2/2005 | Wasshuber |
| 2005/0136655 A1 | 6/2005 | Wasshuber et al. |
| 2005/0184285 A1 | 8/2005 | Friesen et al. |
| 2006/0170011 A1 | 8/2006 | Irisawa et al. |
| 2010/0006821 A1 | 1/2010 | Choi et al. |
| 2010/0062587 A1 | 3/2010 | Wasshuber et al. |
| 2012/0074386 A1 | 3/2012 | Rachmady et al. |
| 2016/0125310 A1 | 5/2016 | Hollenberg et al. |
| 2016/0125311 A1 | 5/2016 | Fuechsle et al. |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0229188 A1 | 7/2019 | Clarke et al. |
| 2019/0229189 A1 | 7/2019 | Clarke et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0341459 A1 | 11/2019 | Pillarisetty et al. |
| 2019/0363181 A1 | 11/2019 | Pillarisetty et al. |

OTHER PUBLICATIONS

"A Reconfigurable Gate Architecture for Si/SiGe Quantum Dots," Zajac et al., Department of Physics, Princeton University; Department of Physics, University of California; Feb. 6, 2015, 5 pages.
"A two-qubit logic gate in silicon," Veldhorst et al., Nature, vol. 526, Oct. 15, 2015, pp. 410-414.
"An addressable quantum dot qubit with fault-tolerant control-fidelity," Veldhorst et al., Nature Nanotechnology vol. 9, Dec. 2014, pp. 981-985.
"Defect reduction of selective Ge epitaxy in trenches on Si(001) substrates using aspect ratio trapping," Park et al., Applied Physics Letter 90, 052113 (2007), pp. 052113-1 through 052113-3.
"Delaying Forever: Uniaxial Strained Silicon Transistors in a 90nm CMOS Technology," Mistry et al., Portland Technology Department, TCAD, Intel Corp., Jul. 2004; 2 pages.
"Detecting big-flip errors in a logical qubit using stabilizer measurements," Riste et al., Nature Communications, 6:6983, DOI: 10.1038/ncomms7983, Apr. 29, 2015, pp. 1-6.
"Embracing the quantum limit in silicon computing," Morton et al, Macmillan Publishers, Nov. 17, 2011, vol. 479, Nature, pp. 345-353.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"Fast sensing of double-dot charge arrangement and spin state with an rf sensor quantum dot," Barthel et al, Materials Department, University of California, Santa Barbara, Jan. 16, 2014, 4 pages.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Photon- and phonon-assisted tunneling in the three-dimensional charge stability diagram of a triple quantum dot array," Braakman et al., Applied Physics Letters 102, 112110 (2013), pp. 112110-1 through 112110-4 (5 pages with cover sheet).
"Platinum single-electron transistors with tunnel barriers made by atomic layer deposition", George et al., Department of Electrical Engineering, University of Notre Dame, Received Jul. 7, 2010:Published Nov. 5, 2010, 3 pages.
"Quantum computation with quantum dots," Loss et al , Physical Review A, vol. 57, No. 1, Jan. 1998, pp. 120-126.
"Radio frequency measurements of tunnel couplings and singlet-triplet spin states in Si:P quantum dots," House et al., Nature Communications, 6:884, DOI: 10.1038/ncomms9848, published Nov. 9, 2015; pp. 1-6.
"Review: Towards Spintronic Quantum Technologies with Dopants in Silicon," Morley, Gavin, Department of Physics, University of Warwick, Jul. 23, 2014; 13 pages.
"Scalable gate architecture for densely packed semiconductor spin qubits," Zajac et al, Department of Physics, Princeton University; Sandia National Laboratories, Jul. 24, 2016; 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 113104-3.
"Single-shot read-out of an individual electron spin in a quantum dot," Elzerman et al., Nature, vol. 430, Jul. 22, 2004, pp. 431-435.
"Spin Relaxation and Decoherence of Holes in Quantum Dots," Bulaev et al., Phys. Rev. Lett. 95, 076805, Aug. 11, 2005, 1 page.
"Ultrafast high-fidelity initialization of a quantum-dot spin qubit without magnetic fields," Mar et al., Phys. Rev. B 90 241303®, published Dec. 15, 2014, 1 page.
"Ultrafast optical control of individual quantum dot spin qubits," De Greve et al, Reports on Progress in Physics, vol. 76, No. 9, Sep. 4, 2013, 2 pages.
"Undoped accumulation-mode Si/SiGe quantum dots," Borselli et al, HRL Laboratories, LLC., Jul. 15, 2014, 4 pages.

\* cited by examiner

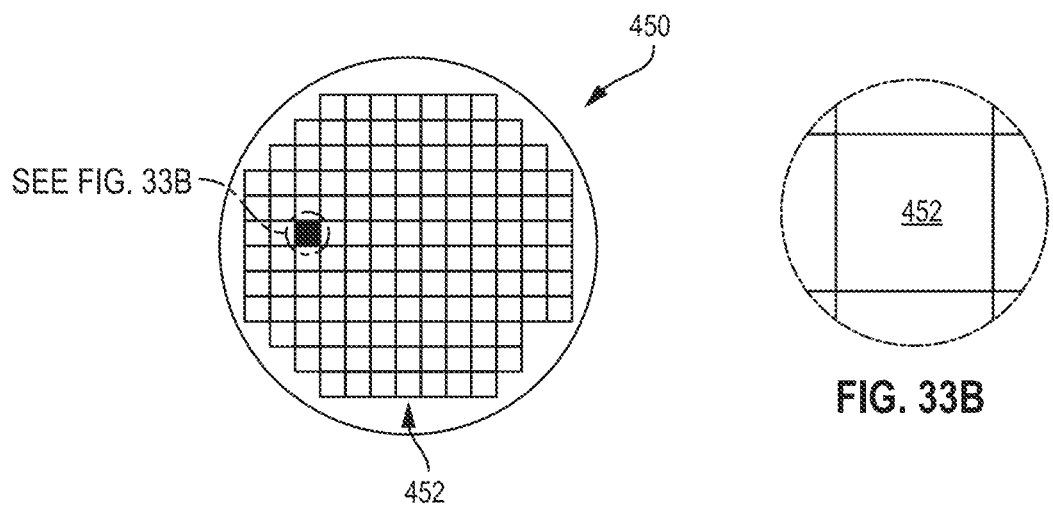
FIG. 33A
FIG. 33B
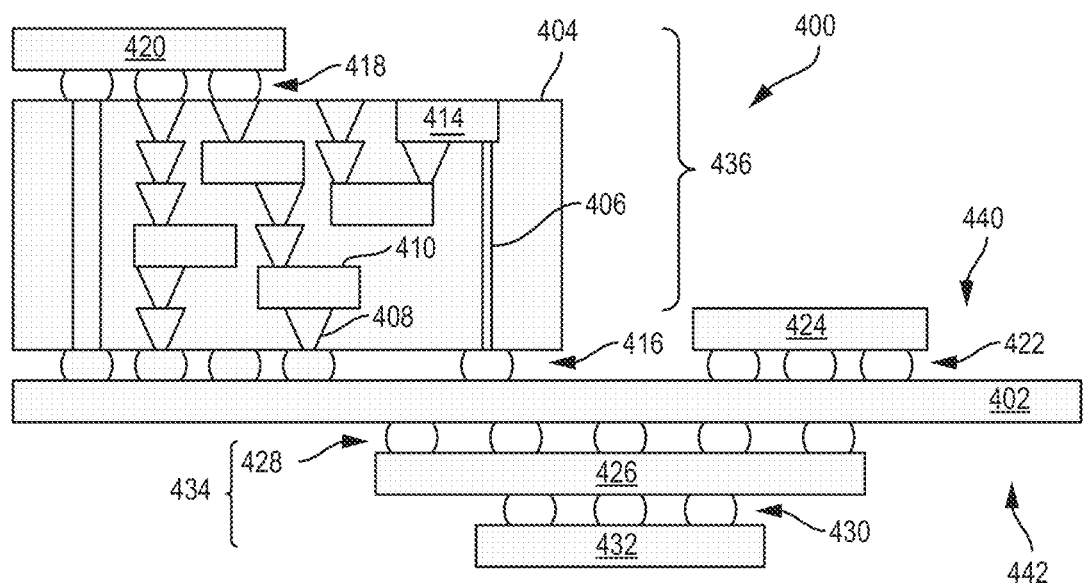
FIG. 34

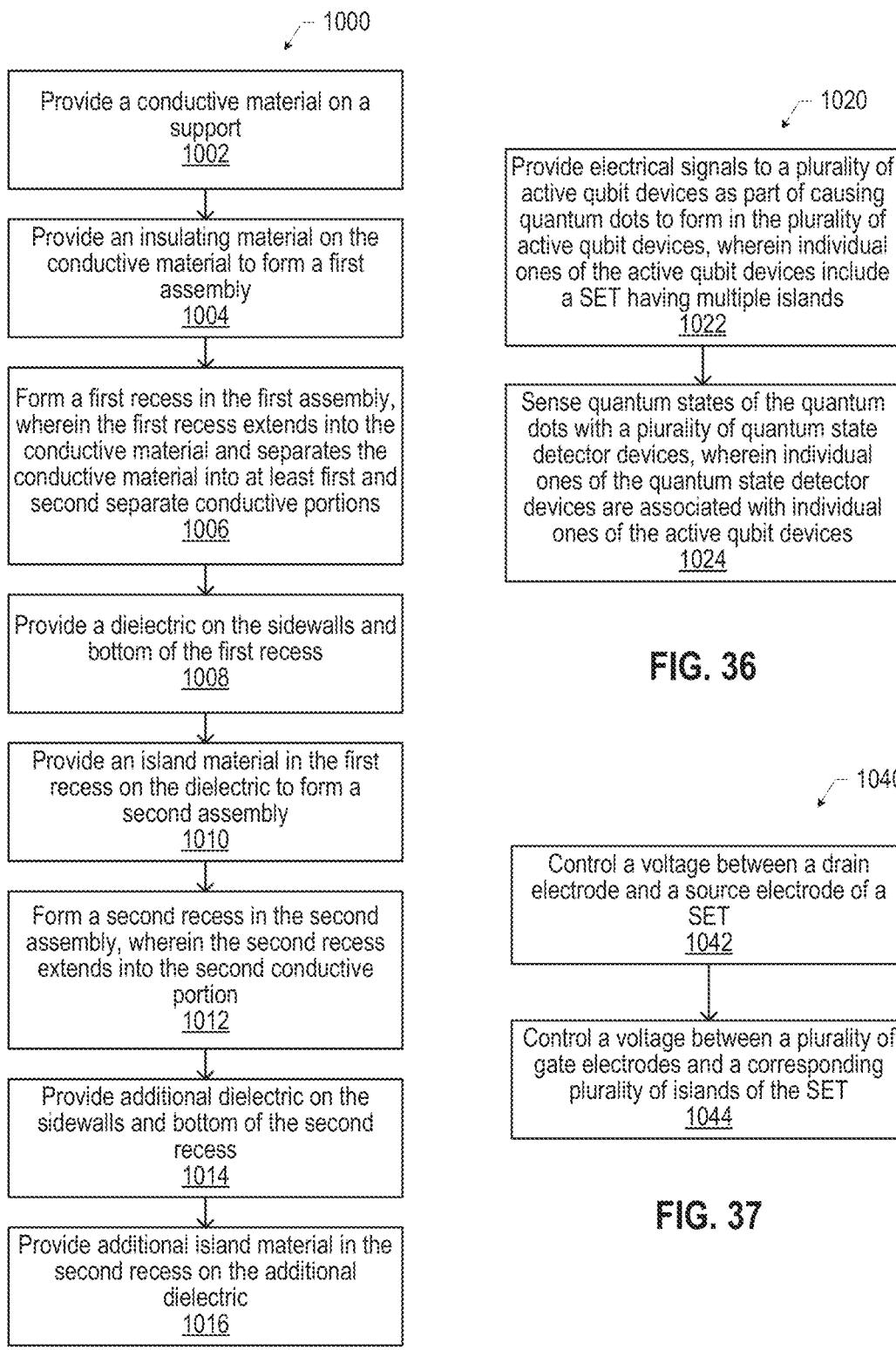
FIG. 35
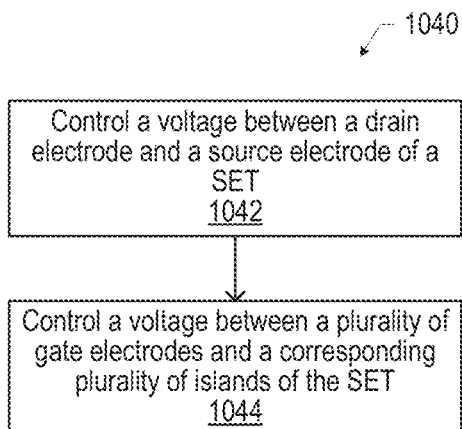
FIG. 36
FIG. 37

SINGLE ELECTRON TRANSISTORS (SETS) AND SET-BASED QUBIT-DETECTOR ARRANGEMENTS

CROSS-REFERENCE TO RELATED APPLICATION

This application is a continuation of U.S. patent application Ser. No. 16/329,706, filed Feb. 28, 2019 and entitled "SINGLE ELECTRON TRANSISTORS (SETS) AND SET-BASED QUBIT-DETECTOR ARRANGEMENTS," which is a national stage application under 35 U.S.C. § 371 of PCT International Application Serial No. PCT/US2016/054613, filed on Sep. 30, 2016 and entitled "SINGLE ELECTRON TRANSISTORS (SETS) AND SET-BASED QUBIT-DETECTOR ARRANGEMENTS," both of which are hereby incorporated by reference herein in their entirety.

BACKGROUND

A single electron transistor (SET) is an electronic device in which carriers flow by tunneling through a pair of tunnel junctions. One conventional approach to SET fabrication is referred to as the Dolan bridge technique; in this technique, a double-layer electron beam resist and a double-angle evaporation are performed to deposit the metals that form the SET.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 33A and 33B are top views of a wafer and dies that may include any of the SET devices and/or qubit-detector arrangements disclosed herein.

FIG. 34 is a cross-sectional side view of a device assembly that may include any of the SET devices and/or qubit-detector arrangements disclosed herein.

FIG. 35 is a flow diagram of an illustrative method of manufacturing a SET device, in accordance with various embodiments.

FIG. 36 is a flow diagram of an illustrative method of operating a qubit-detector arrangement, in accordance with various embodiments.

FIG. 37 is a flow diagram of an illustrative method of operating a SET device, in accordance with various embodiments.

DETAILED DESCRIPTION

Disclosed herein are single electron transistor (SET) devices, and related methods and devices. In some embodiments, a SET device may include: first and second source/drain (S/D) electrodes; a plurality of islands, disposed between the first and second S/D electrodes; and dielectric material disposed between adjacent ones of the islands, between the first S/D electrode and an adjacent one of the islands, and between the second S/D electrode and an adjacent one of the islands.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

Figure 1A:
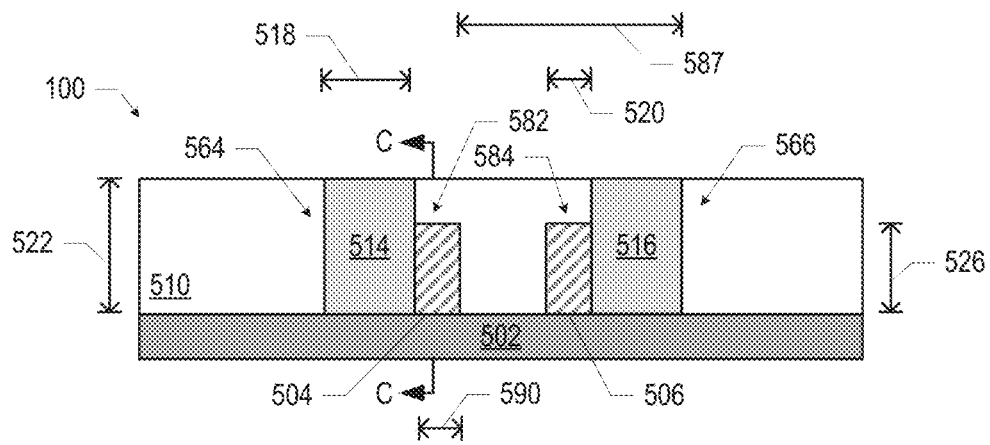
FIGS. 1A-1F are various views of a single electron transistor (SET) device, in accordance with various embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale. For ease of discussion, all of the lettered sub-figures associated with a particular numbered figure may be referred to by the number of that figure; for example, FIGS. 1A-1F may be referred to as "FIG. 1," FIGS. 2A-2C may be referred to as "FIG. 2," etc.

Figure 1B:
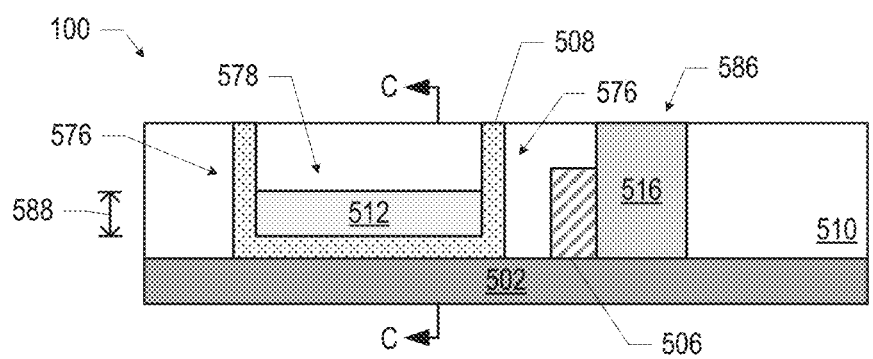
Figure 1C:
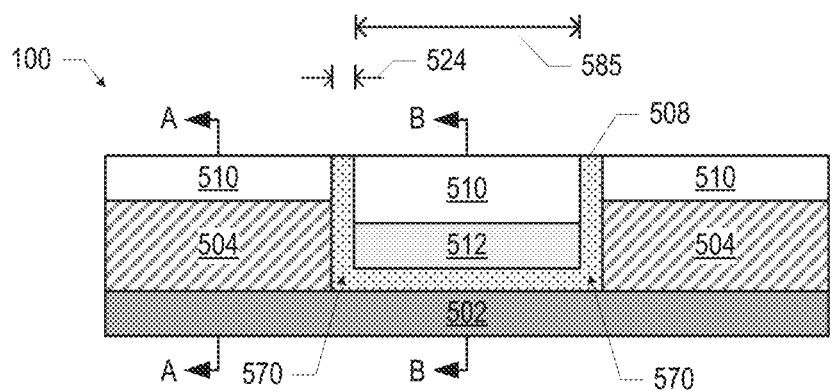
Figure 1D:
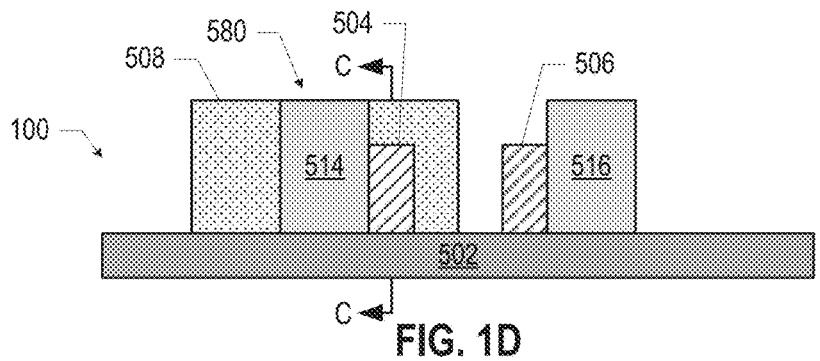
Figure 1E:
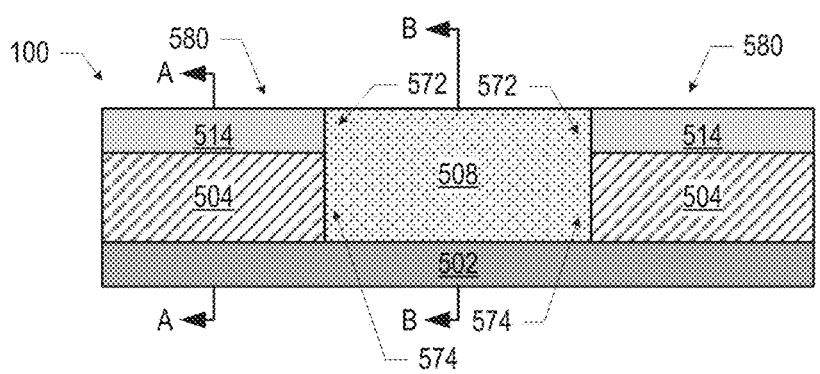
Figure 1F:
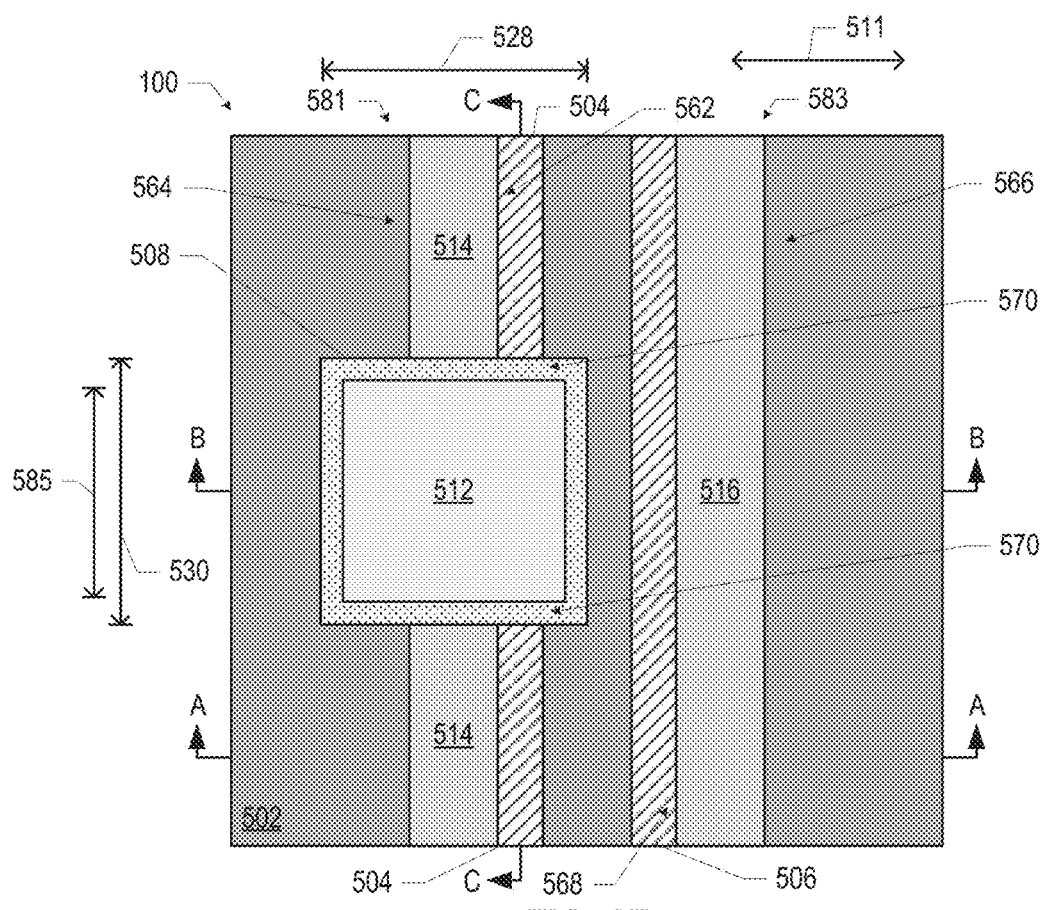
Figure 2A:
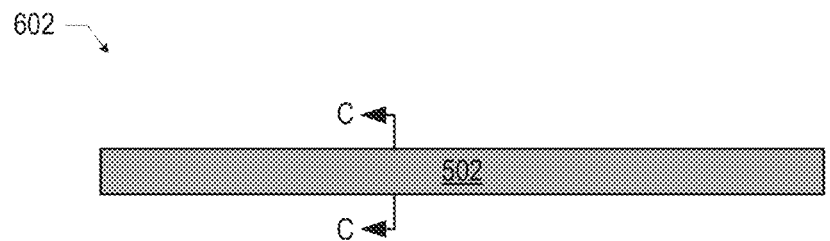
FIGS. 2A-2C, 3A-3C, 4A-4C, 5A-5C, 6A-6C, 7A-7C, 8A-8C, 9A-9C, 10A-10C, 11A-11C, 12A-12C, and 13A-13C illustrate various example stages in the manufacture of the SET device of FIGS. 1A-1F, in accordance with various embodiments.
Figure 2B:
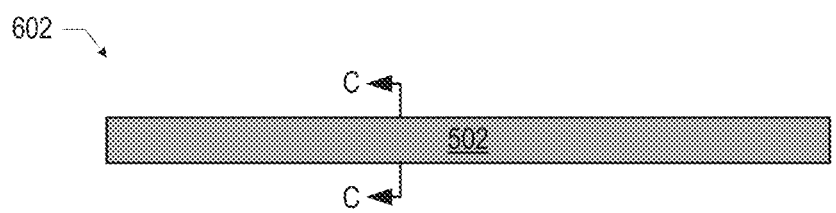
Figure 2C:
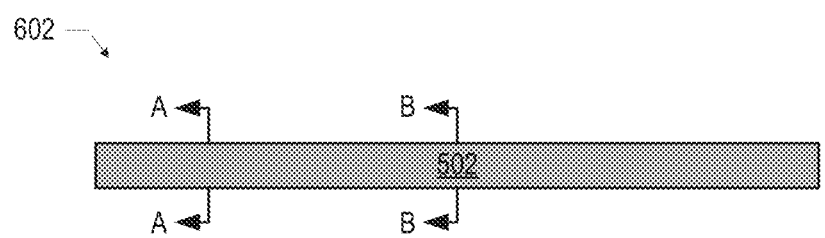

FIG. 1 provides various views of a first embodiment of a SET device 100. In particular, FIG. 1A is a cross-sectional view of the SET device 100 through the section A-A of FIGS. 1C, 1E, and 1F;

FIG. 1B is a cross-sectional view of the SET device 100 through the section B-B of FIGS. 1C, 1E, and 1F; FIG. 1C is a cross-sectional view of the SET device 100 through the section C-C of FIGS. 1A, 1B, 1D, and 1F; FIG. 1D is a side view of the SET device 100 toward the section A-A with the insulator 510 removed; FIG. 1E is a side view of the SET device 100 toward the section C-C from the gate electrode 506 with the insulator 510 removed; and FIG. 1F is a top view of the SET device 100 with the insulator 510 removed.

As illustrated in FIG. 1, the SET device 100 may include a source/drain (S/D) structure 581 including two S/D supports 514 disposed on a substrate 502. The S/D structure 581 may also include an S/D electrode 504 disposed on the side faces 562 of the S/D supports 514; in the embodiment of FIG. 1, no electrode may be disposed on the opposite side faces 564 of the S/D supports 514. The two S/D supports 514, and the two S/D electrodes 504, may be spaced apart by intervening dielectric 508 and an island 512. In particular, the SET device 100 may include two tunnel junctions (TJs) 570, each formed by a portion of dielectric 508 "sandwiched" between an S/D electrode 504 and the island 512. The S/D structure 581 may include the S/D supports 514, the dielectric 508, the S/D electrodes 504, and the island 512.

The dielectric 508 may extend up the sidewalls 572 of the S/D supports 514, and up the sidewalls 574 of the S/D electrodes 504. In some embodiments, the dielectric 508 may extend along the substrate 502 between the S/D supports 514 and the S/D electrodes 504 such that a portion of the dielectric 508 is disposed between the island 512 and the substrate 502. The dielectric 508 may also extend up sidewalls 576 of the insulator 510, as shown. In some embodiments, the dielectric 508 may have a substantially uniform thickness 524 between 0.5 and 5 nanometers (e.g., 1 nanometer).

The island 512 may be disposed at the bottom of the "box" formed by the dielectric 508. In some embodiments, the top face 578 of the island 512 may be recessed back from the top faces 580 of the S/D supports 514; in some such embodiments, a portion of the insulator 510 may be disposed in the "box" formed by the dielectric 508 such that the island 512 is disposed between this portion of the insulator 510 and the substrate 502. In some embodiments, the island 512 may have a thickness 588 between 5 and 30 nanometers (e.g., 10 nanometers).

The SET device 100 may also include a gate structure 583. The gate structure 583 may include a support 516 disposed on the substrate 502. The gate structure 583 may also include a gate electrode 506 disposed on a side face 568 of the gate support 516; in the embodiment of FIG. 1, no electrode may be disposed on the opposite side face 566 of the gate support 516. The S/D electrodes 504, the dielectric 508, the island 512, and the gate electrode 506 may together provide a SET.

During use of the SET devices 100 disclosed herein, a voltage may be applied across the S/D electrodes 504 and to the gate electrode 506 to provide a potential for carriers (e.g., electrons) to tunnel through the TJs 570 into and out of the island 512. In particular, the gate electrode 506 may be capacitively coupled to the island 512, and thus the potential of the gate electrode 506 may be used to tune the potential of the island 512. Because carriers (e.g., electrons) enter the island 512 via tunneling, the flow of carriers into the island 512 is a discrete phenomenon, and may be characterized by the number of carriers occupying the island 512 at any given time. The conductance of the island 512 (and thus the conductance of the SET device 100) may change in response to electrical charges proximate to the island 512, and the rate of change of this conductance may be a function of the voltage on the gate electrode 506. Thus, when the SET device 100 is to be used as a charge detector (and thus a large change in conductance is desired when a charge is present), the voltage on the gate electrode 506 may be set to a bias level corresponding to a steep slope of the bias-conductance curve of the SET device 100. In some embodiments, the SET device 100 may be used as a charge detector in a quantum computing setting to detect the state of a proximate qubit (e.g., to detect the spin state of an electron trapped in a proximate quantum well).

In some embodiments, the SET devices 100 disclosed herein may themselves be used as a qubit in a quantum computing device. For example, an electron may be confined in the island 512, and the spin of the electron may be used as a qubit for quantum computations. Thus, any of the SET devices 100 disclosed herein may be used in a computing device to detect the state of spin-based qubits, provide spin-based qubits, or both.

In some embodiments, the top faces 582 of the S/D electrodes 504 may be recessed back from the top faces 580 of the S/D supports 514. Similarly, in some embodiments, the top face 584 of the gate electrode 506 may be recessed back from the top face 586 of the gate support 516. In some embodiments, the gate electrode 506 and the S/D electrodes 504 may have a same height 526. In other embodiments, the gate electrode 506 and the S/D electrodes 504 may have different heights. Generally, the height 526 of the gate electrode 506 and/or the S/D electrodes 504 may be between 5 and 15 nanometers (e.g., 10 nanometers). In some embodiments, the S/D supports 514 and the gate support 516 may have a same height 522. In other embodiments, the S/D supports 514 and the gate support 516 may have different heights. Generally, the height 522 of the gate support 516 and/or the S/D supports 514 may be between 20 and 100 nanometers (e.g., between 30 and 80 nanometers, or approximately equal to 50 nanometers). In some embodiments, the S/D supports 514 and the gate support 516 may have a same width 518. In other embodiments, the S/D supports 514 and the gate support 516 have different widths. Generally, the width 518 of the S/D supports 514 and/or the gate support 516 may be between 20 and 100 nanometers (e.g., 40 nanometers).

The S/D electrodes 504 may have a width 590 between 1 and 10 nanometers (e.g., 5 nanometers). Smaller S/D electrodes 504 may be suitable for higher temperature (e.g., room temperature) operation; for example, the width 590 may between 1 and 5 nanometers (e.g., 2 nanometers). In some embodiments, the width 520 of the gate electrode 506 may be the same as the width 590 of the S/D electrodes 504.

In some embodiments, the width 520 of the gate electrode 506 may be different from the width 590 of the S/D electrodes 504. Generally, the width 520 of the gate electrode 506 may take the form of any of the embodiments discussed herein with reference to the width 590 of the S/D electrodes 504. In some embodiments, the spacing 587 of the S/D electrodes 504 and the gate support 516, as shown in FIG. 1A, may be between 80 and 200 nanometers (e.g., 100 nanometers).

As illustrated in FIG. 1, in some embodiments, the dielectric 508 may laterally extend beyond the area between the two S/D supports 514 (e.g., in the dimension indicated by the arrow 511). The dielectric 508 may also laterally extend beyond the area between the two S/D electrodes 504. Similarly, in some embodiments, the island 512 may laterally extend beyond the area between the two S/D supports 514, and the island 512 may laterally extend beyond the area between the two S/D electrodes 504. In some embodiments, the footprint of the dielectric 508 may have a lateral dimension 530 (in the direction of the axis between the S/D electrodes 504) between 25 and 105 nanometers (e.g., between 40 and 50 nanometers). In some embodiments, the island 512 may have a lateral dimension 585 (in the direction of the axis between the S/D electrodes 504) between 25 and 100 nanometers (e.g., 40 nanometers). In some embodiments, the dielectric 508 may have a lateral dimension 528 (perpendicular to the axis between the S/D electrodes 504) between 25 and 100 nanometers (e.g., 40 nanometers).

Generally, the smaller the island 512, the better the charge sensitivity of any of the SET devices 100 disclosed herein for a given temperature when the self-capacitance of the SETs is the dominant capacitance. In particular, the SET device 100 may have an associated charging energy, representative of the rate of change of conductance in response to proximate charges; a larger charging energy represents greater sensitivity to proximate charges. The charging energy may be inversely proportional to the self-capacitance of the island 512, and the self-capacitance of the island may be proportional to the size of the island 512. As the temperature of the environment of a SET device 100 increases (e.g., to room temperature), the sensitivity of the SET device 100 is typically compromised. Larger charging energies may help a SET device 100 achieve an adequate sensitivity at higher temperatures (e.g., room temperature), and thus smaller islands 512 may be advantageous in SET devices 100 that are to operate at these higher temperatures when self-capacitance of the islands 512 are the dominant capacitances.

Any suitable materials may be used in the SET device 100 of FIG. 1. The S/D supports 514 and the gate support 516 may be "dummy" structures that provide a mechanical support against which the S/D electrodes 504 and the gate electrode 506 may be formed, respectively. In some embodiments, the S/D supports 514 and the gate support 516 may be formed from an insulating material, such as an oxide. The S/D electrodes 504 and the gate electrode 506 may be formed from any suitable conductive material, such as a metal. In some embodiments, the S/D electrodes 504 and the gate electrode 506 may be formed of a noble metal, which may provide advantageous resistance to corrosion during manufacture and thereby facilitate the reliable construction of the TJs 570 (due to the absence of oxide interference).

The insulator 510 may be a suitable dielectric material, such as any interlayer dielectric (ILD) material. The dielectric 508 may be silicon oxide, carbon-doped oxide, or any suitable low-k dielectric material. The island 512 may be a semiconductor material (e.g., silicon) or a metal (e.g., a noble metal, such as copper or platinum), in various embodiments.

Although a single SET device 100 is illustrated in FIG. 1, a device may include an array of SET devices 100 (e.g., by tiling the SET device 100 illustrated in FIG. 1F in a one-dimensional or two-dimensional array, alternating the S/D structures 581 and the gate structures 583).

Any suitable process may be used to manufacture the SET device 100 of FIG. 1. For example, FIGS. 2-13 depict various cross-sectional views of stages in an example process for manufacturing the SET device 100 of FIG. 1. The materials and dimensions of various components of the stages illustrated in FIGS. 2-13 may take the form of any of the embodiments discussed herein. In FIGS. 2-13, the "A" sub-figures represent cross-sectional views through the section A-A (analogous to FIG. 1A), the "B" sub-figures represent cross-sectional views through the section B-B (analogous to FIG. 1B), and the "C" sub-figures represent cross-sectional views through the section C-C (analogous to FIG. 1C).

FIG. 2 depicts an assembly 602 including a substrate 502. The substrate 502 may take any of the forms discussed above with reference to FIG. 1; for example, the substrate 502 may be a semiconductor wafer or a structure disposed on a semiconductor wafer.

Figure 3A:
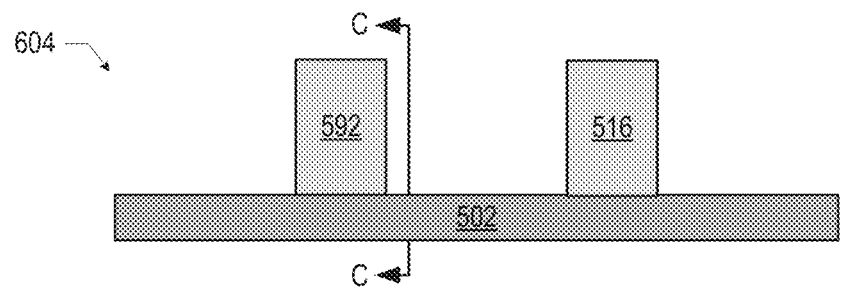
Figure 3B:
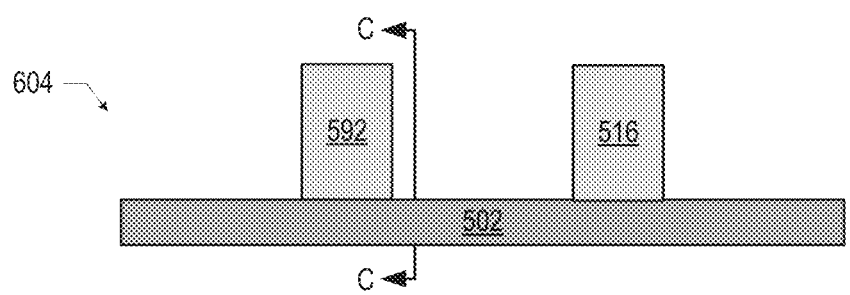
Figure 3C:
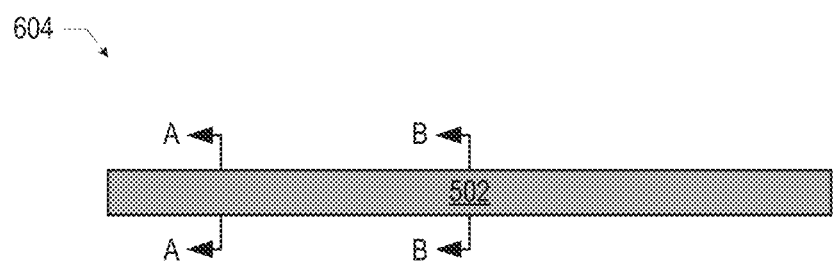

FIG. 3 depicts an assembly 604 subsequent to providing support material 592 and the gate support 516 on the substrate 502 of the assembly 604 (FIG. 2). In some embodiments, the support material 592 and the gate support 516 may each be shaped substantially as a rectangular solid. The support material 592 and the gate support 516 may each take the form of "fins" extending from the substrate 502, and may be formed using any suitable technique. For example, in some embodiments, an insulating material may be blanket-deposited on the substrate 502, and patterned to form the support material 592 and the gate support 516. In other embodiments, a sacrificial material may be blanket-deposited on the substrate 502, trenches may be formed in the sacrificial material down to the substrate 502, the trenches may be filled with insulating material to form the support material 592 and the gate support 516, and then the sacrificial material may be removed. These embodiments are simply examples, and any desired technique may be used to form the support material 592 and the gate support 516 on the substrate 502.

Figure 4A:
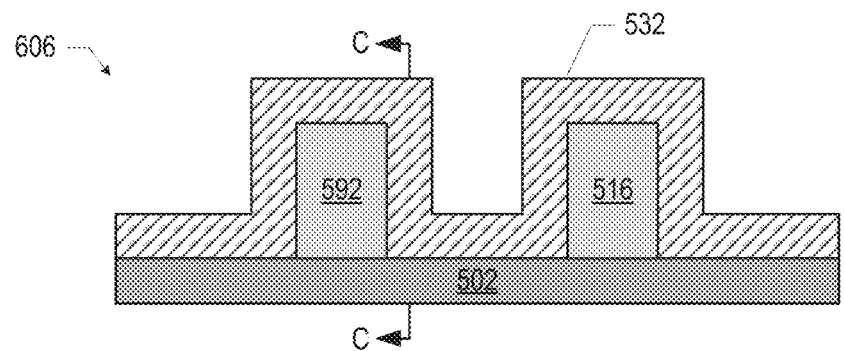
Figure 4B:
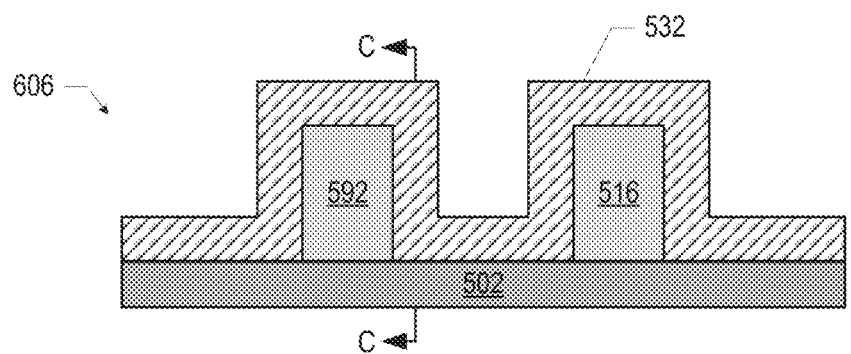
Figure 4C:
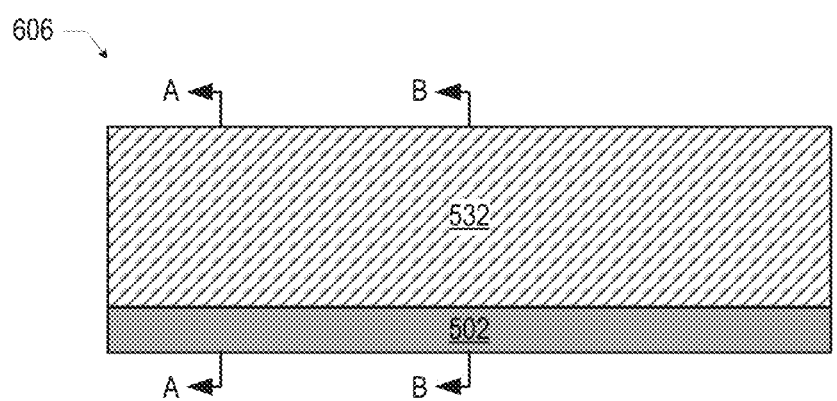

FIG. 4 depicts an assembly 606 subsequent to depositing conductive material 532 on the assembly 604 (FIG. 3). In some embodiments, the conductive material 532 may be conformally deposited on the assembly 604, extending over the support material 592 and the gate support 516 and the exposed substrate 502, to a desired thickness. The thickness of the conductive material 532 may be substantially equal to the widths 590 and 520, discussed above. Such conformal deposition may be performed by, for example, atomic layer deposition (ALD). Using ALD to deposit the conductive material 532 may allow the thickness of the deposition to be very well controlled, helping achieve a small and reliably sized SET device 100.

Figure 5A:
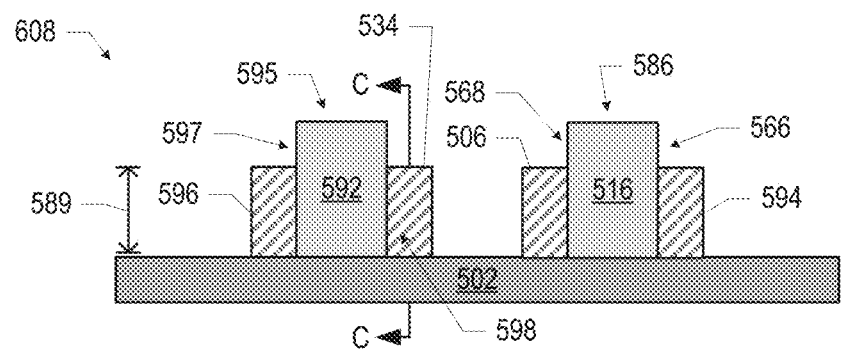
Figure 5B:
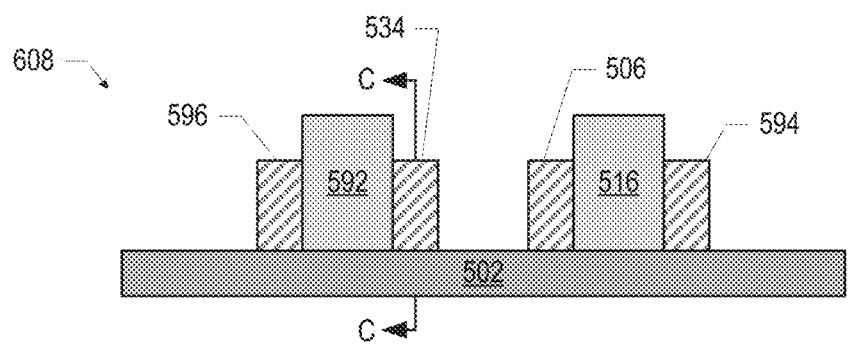
Figure 5C:
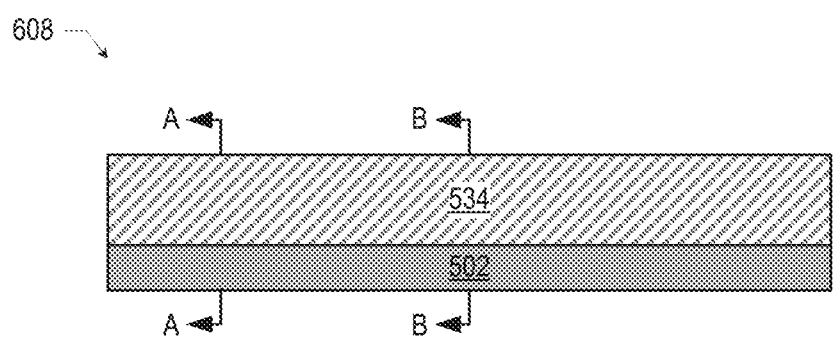

FIG. 5 depicts an assembly 608 subsequent to directionally etching back the conductive material 532 of the assembly 606 (FIG. 4) to remove a desired thickness of the conductive material 532 in the "vertical" direction and leave a desired height 589 of the conductive material 532. The height 589 may be equal to the height 526 discussed above. In particular, the conductive material 532 may be removed from the top face 595 of the support material 592, the top face 586 of the gate support 516, and from exposed areas of the substrate 502 where the thickness of the conductive material 532 was less than or equal to the thickness removed. The directional etching may leave portions of the conductive material 532 on the side faces of the support material 592 and the gate support 516. In particular, conductive material 596 may be disposed on the side face 597 of the support material 592, conductive material 534 may be disposed on the side face 598 of the support material 592, the gate electrode 506 may be disposed on the side face 568 of the gate support 516, and conductive material 594 may be disposed on the side face 566 of the gate support 516. As discussed above with reference to FIG. 1, in some embodiments, the conductive material 532 may be recessed below the top faces 595 and 586 of the support material 592 and the gate support 516, respectively. Techniques other than the directional etching described above may be used to form the assembly 608 from the assembly 606. For example, in some embodiments, a sacrificial light absorbing material (SLAM) may be deposited on the assembly 606 and recessed back to the desired height 589 (e.g., using a timed dry etch); a desired thickness of the conductive material 532 that extends beyond the SLAM may be etched away, then the SLAM may be removed and the conductive material 532 etched again to further recess the conductive material 532 on the side faces of the support material 592 and the gate support 516 and remove the conductive material 532 from exposed areas of the substrate 502.

Figure 6A:
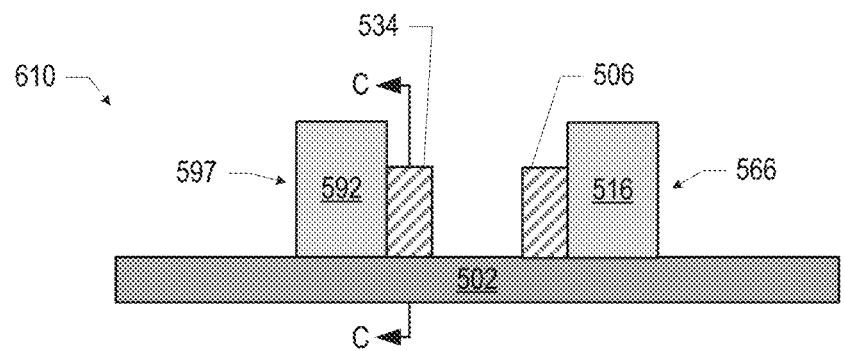
Figure 6B:
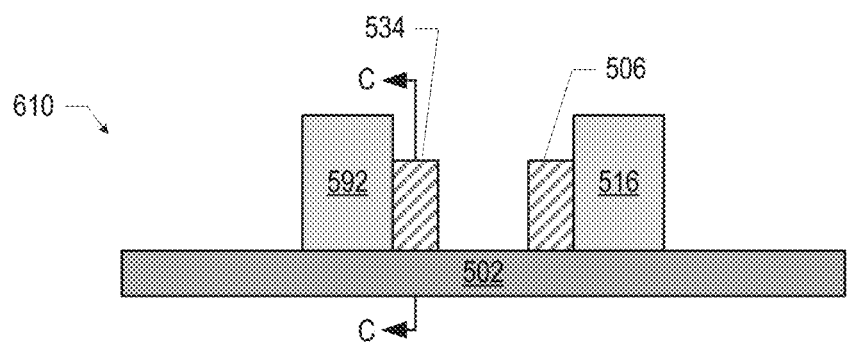
Figure 6C:
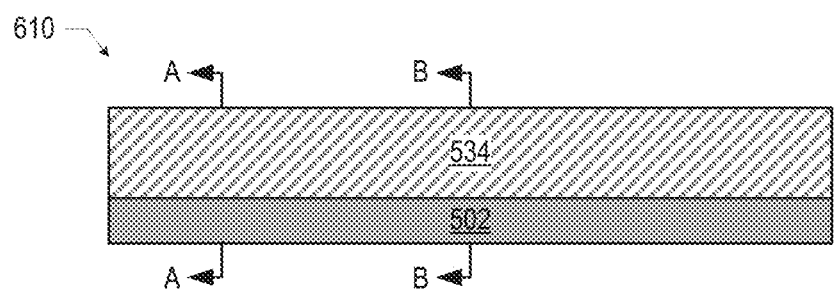

FIG. 6 depicts an assembly 610 subsequent to removing the conductive material 596 from the side face 597 of the support material 592 of the assembly 608 (FIG. 5), and removing the conductive material 594 from the side face 566 of the gate support 516 of the assembly 608. In some embodiments, the conductive material 596 and the conductive material 594 may be removed by providing an appropriate mask to the assembly 608 (that exposes the conductive material 596 and the conductive material 594) and then etching away the exposed conductive material 596 and the conductive material 594. In other embodiments, the conductive material 596 and the conductive material 594 may not be formed on the support material 592 and the gate support 516, respectively, at all. Instead, an insulating material (e.g., the insulator 510, as discussed below with reference to FIG. 7) may be deposited on the assembly 604 (FIG. 3) and polished back to expose the top face 595 of the support material 592 and the top face 586 of the gate support 516; the insulating material may be patterned to expose the substrate 502 between the support material 592 and the gate support 516; the conductive material 532 may be conformally deposited on this assembly (e.g., using the techniques discussed above with reference to FIG. 4); and then a directional etch may be performed on the conductive material 532, resulting in an assembly similar to that illustrated in FIG. 6 but with insulating material on the side face 597 of the support material 592 and the side face 566 of the gate support 516. This assembly may be processed in substantially the same manner as discussed below, and thus represents one alternative approach to that explicitly illustrated in FIGS. 2-13.

Figure 7A:
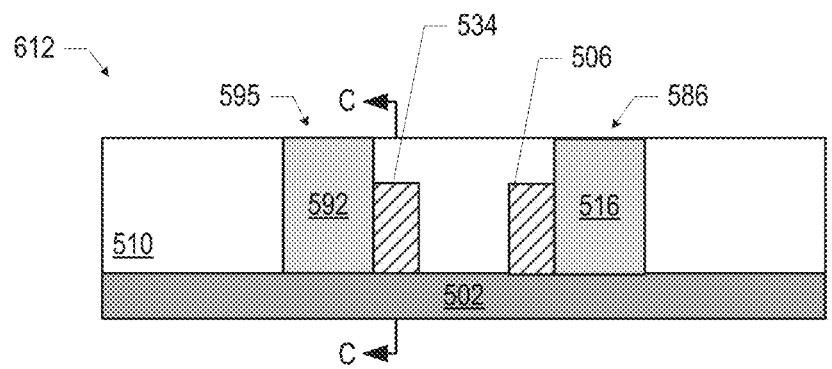
Figure 7B:
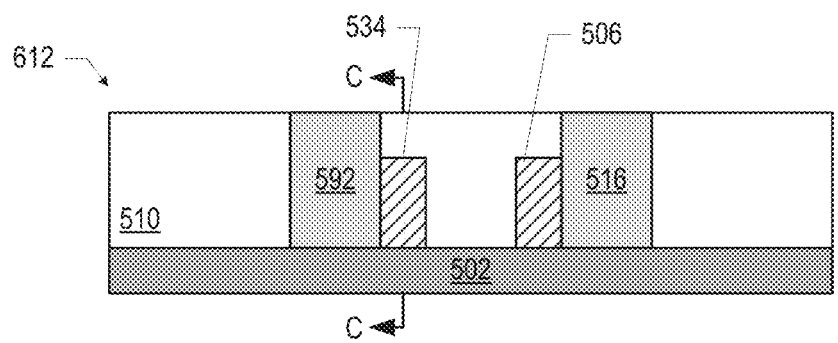
Figure 7C:
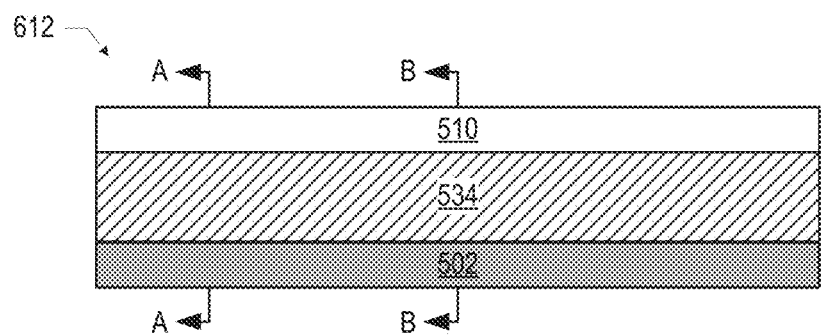

FIG. 7 depicts an assembly 612 subsequent to depositing an insulator 510 on the assembly 610 (FIG. 6). In the assembly 612, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 8A:
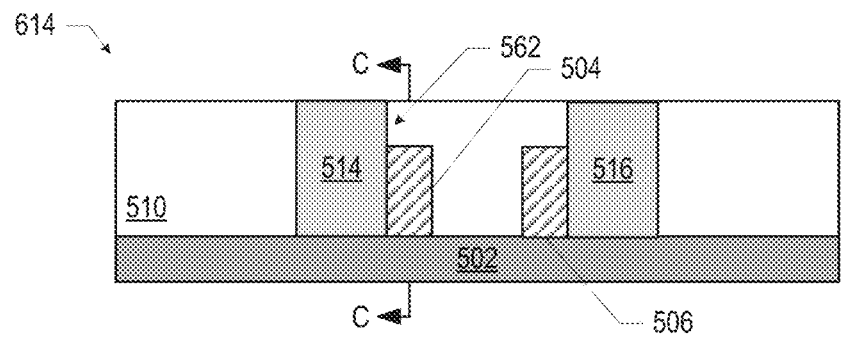
Figure 8B:
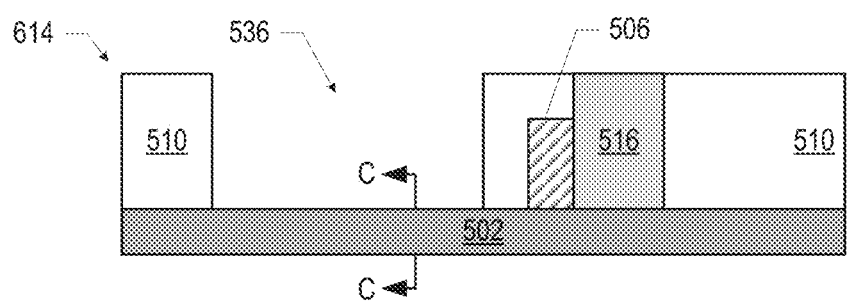
Figure 8C:
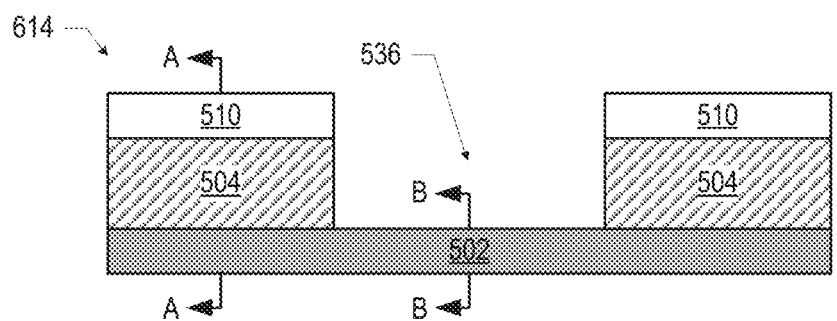

FIG. 8 depicts an assembly 614 subsequent to forming a recess 536 in the assembly 612 (FIG. 7). The recess 536 may have the footprint of the dielectric 508 illustrated in FIG. 1F (e.g., a substantially rectangular footprint), and may divide the support material 592 of FIG. 7 into the two S/D supports 514, and thus the lateral dimensions of the recess 536 may take any of the forms of the lateral dimensions 530 and 528 discussed herein. The recess 536 may similarly divide the conductive material 534 into two S/D electrodes 504 (disposed on the side faces 562 of the S/D supports 514). The recess 536 may be spaced apart from the gate electrode 506 by a portion of the insulator 510, as shown. Any suitable technique may be used to form the recess 536, and the appropriate technique may depend on the desired dimensions of the recess 536. In some embodiments, the recess 536 may be formed by a hole shrink technique, or extreme ultraviolet lithography, for example.

Figure 9A:
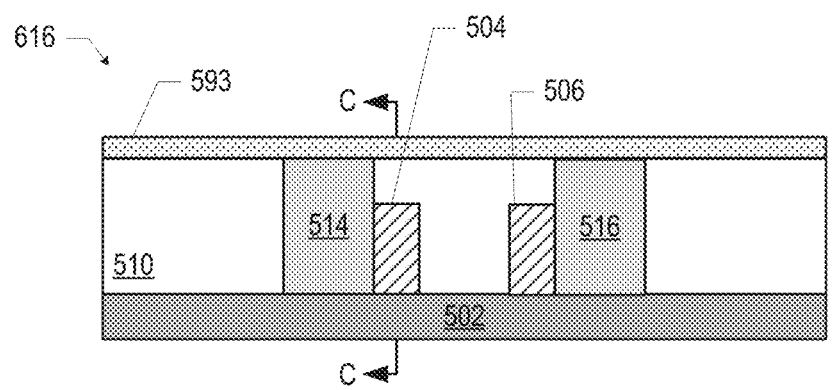
Figure 9B:
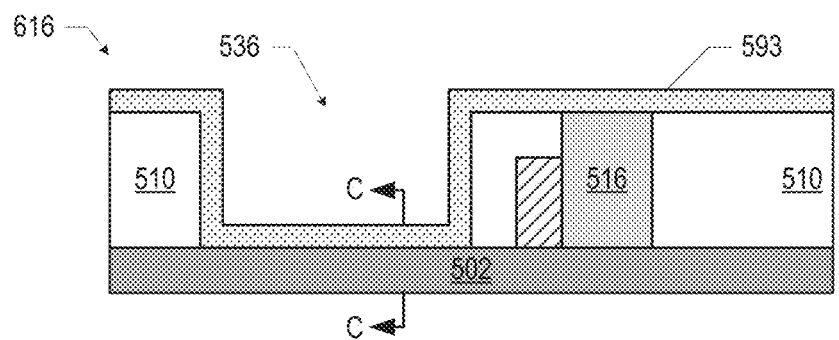
Figure 9C:
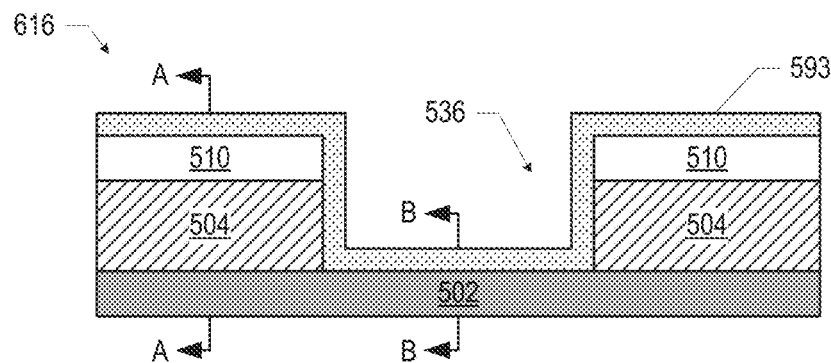

FIG. 9 depicts an assembly 616 subsequent to conformally depositing a dielectric material 593 on the assembly 614 (FIG. 8). The dielectric material 593 may be the material of the dielectric 508 (as discussed below), and it may be deposited on the sidewalls and bottom of the recess 536, as shown. The thickness of the dielectric material 593 may be substantially equal to the thickness 524, discussed above. Such conformal deposition may be performed by, for example, ALD (which may provide a desirably well-controlled deposition thickness).

Figure 10A:
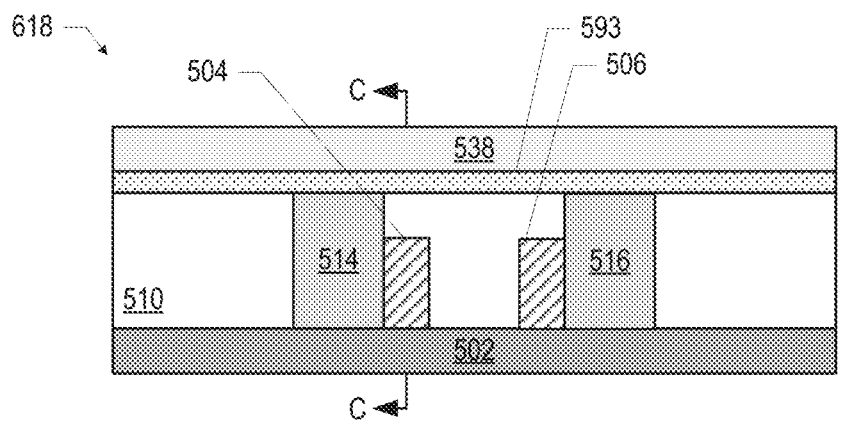
Figure 10B:
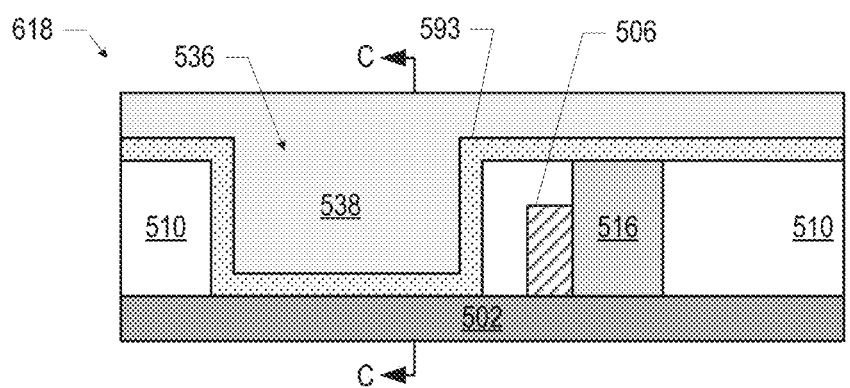
Figure 10C:
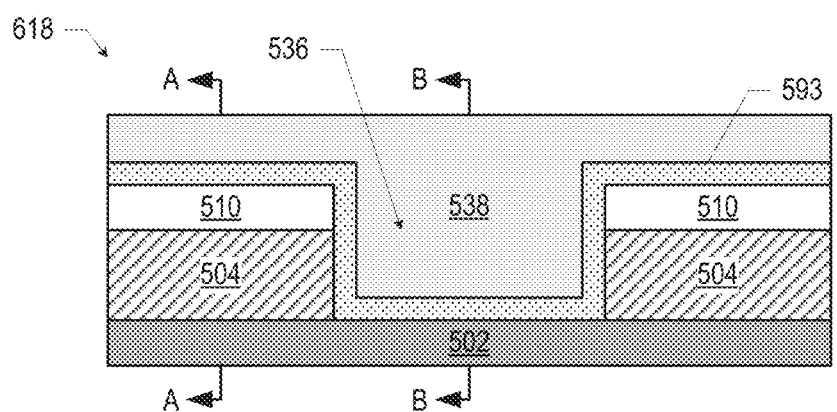

FIG. 10 depicts an assembly 618 subsequent to depositing an island material 538 on the assembly 616 (FIG. 9). The island material 538 may, as illustrated in FIG. 10, fill the recess 536, and in some embodiments, may extend beyond the recess 536 and over the S/D supports 514 and the gate support 516. The island material 538 may be deposited using any suitable technique, such as chemical vapor deposition (CVD) or atomic layer deposition (ALD).

Figure 11A:
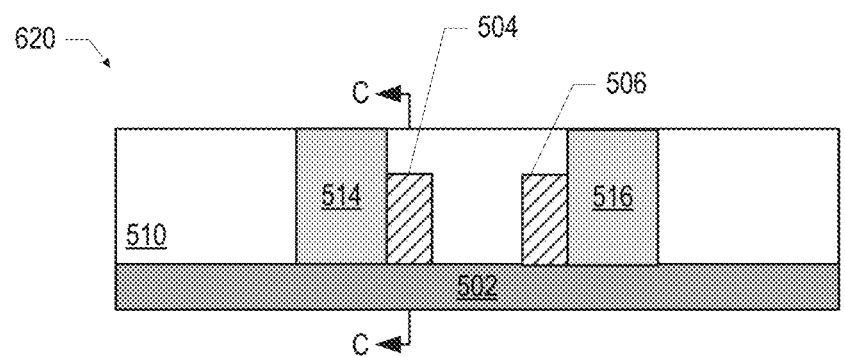
Figure 11B:
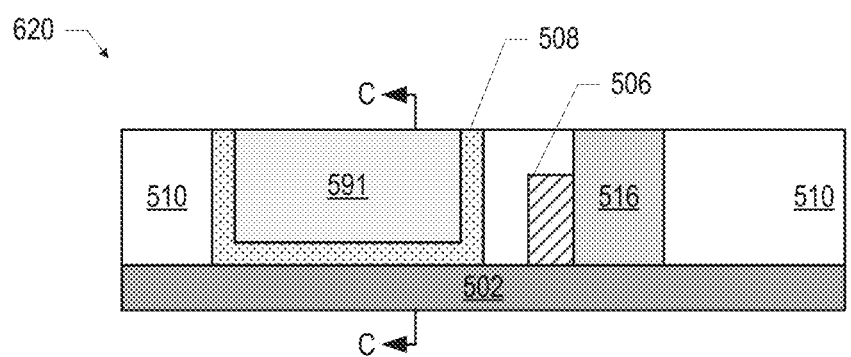
Figure 11C:
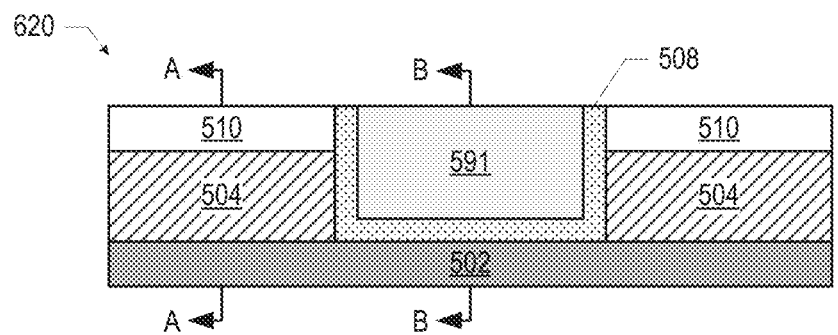

FIG. 11 depicts an assembly 620 subsequent to polishing the assembly 618 (FIG. 10) to remove the dielectric material 593 and the island material 538 that extended beyond the recess 536 in the assembly 618, forming the dielectric 508 and island material 591, respectively. In some embodiments, a CMP technique may be used to polish the assembly 618. In some embodiments, this polishing operation may not remove all of the dielectric material 593 that extends beyond the recess 536; some or all of that "excess" dielectric material 593 may remain in the assembly 620.

Figure 12A:
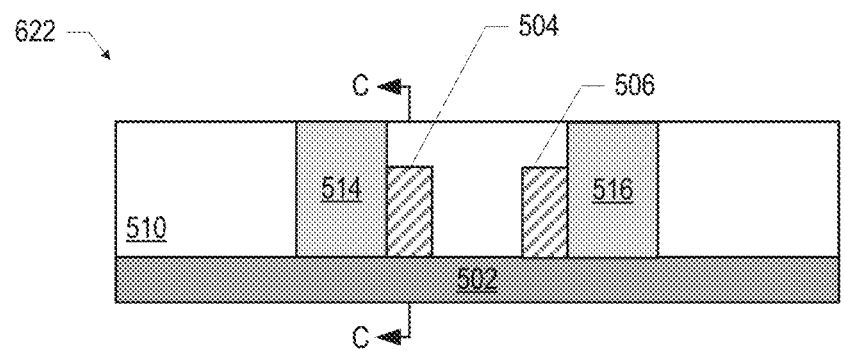
Figure 12B:
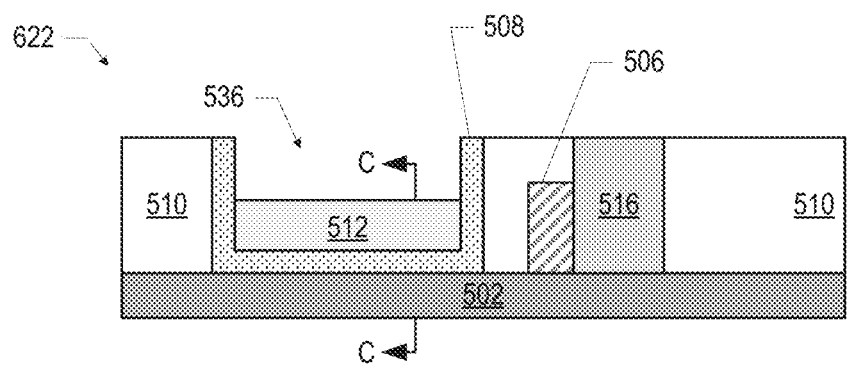
Figure 12C:
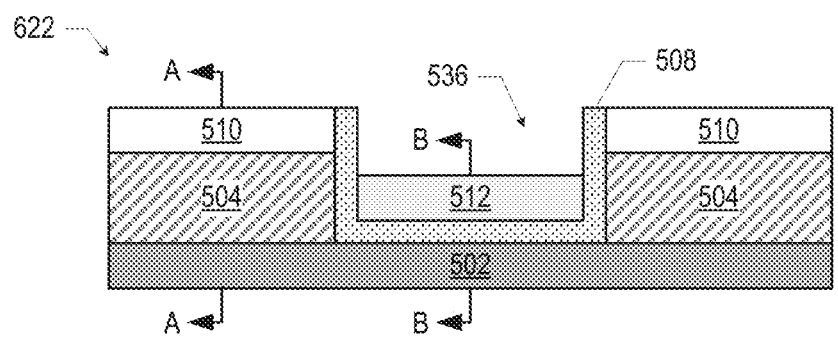

FIG. 12 depicts an assembly 622 subsequent to recessing the island material 591 of the assembly 620 (FIG. 11) back into the recess 536 to form the island 512. The island material 591 may be recessed using any suitable technique (e.g., using a dry etch, followed by a wet clean, as appropriate for the material composition of the island material 591).

Figure 13A:
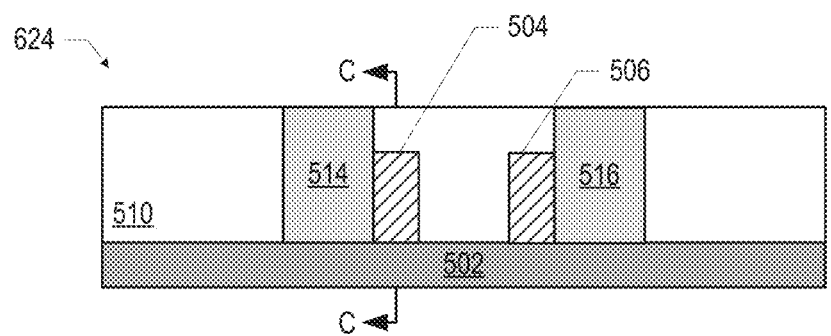
Figure 13B:
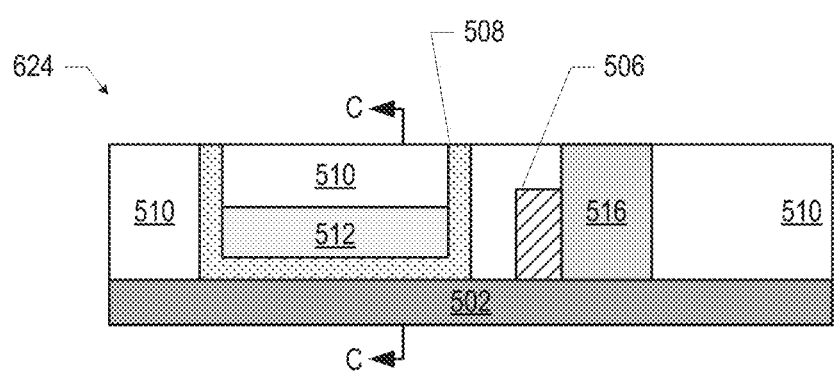
Figure 13C:
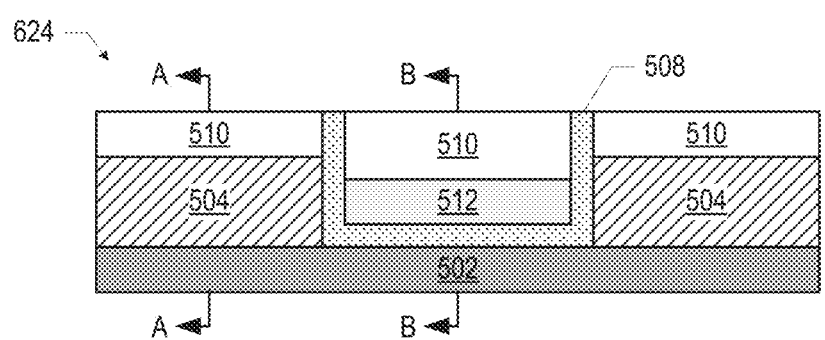
Figure 14A:
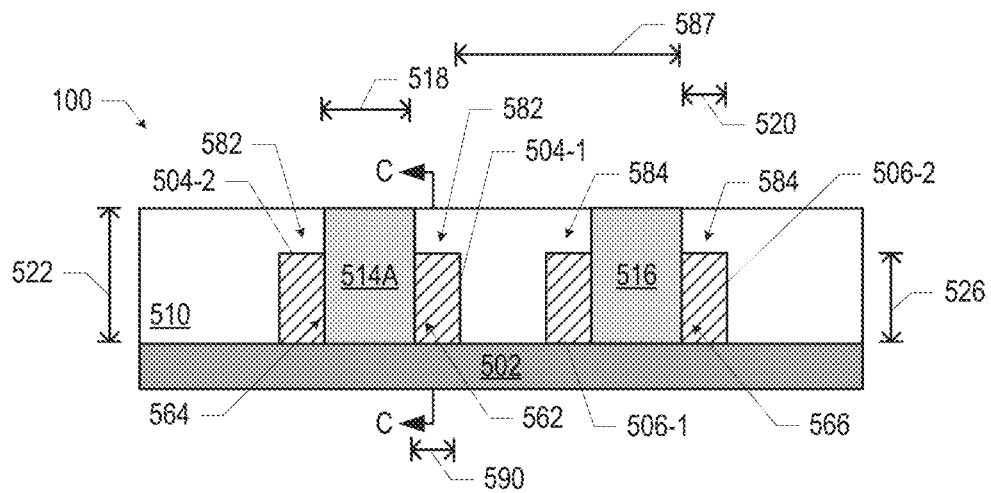
FIGS. 14A-14F are various views of another SET device, in accordance with various embodiments.
Figure 14B:
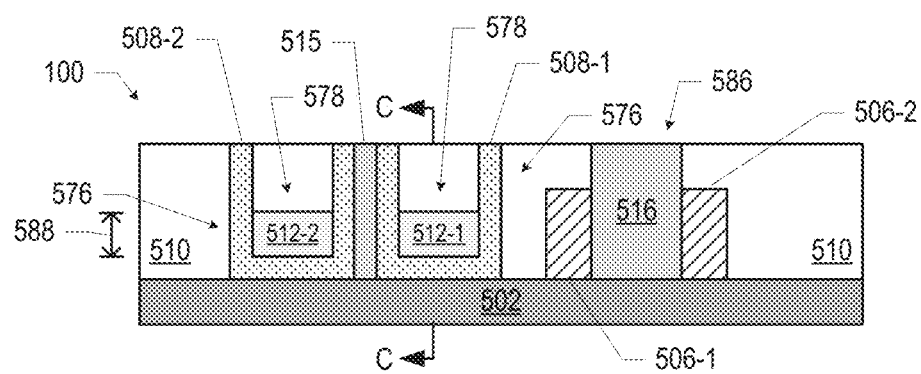
Figure 14C:
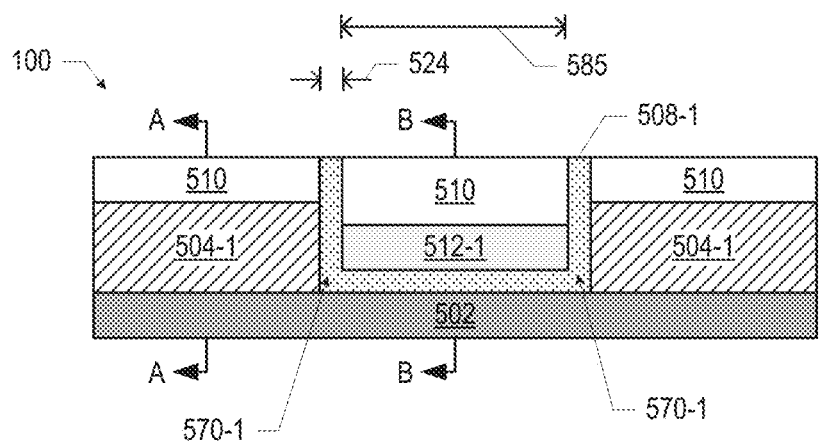
Figure 14D:
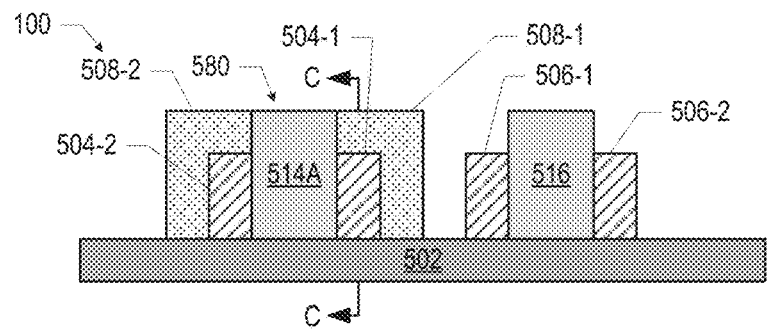
Figure 14E:
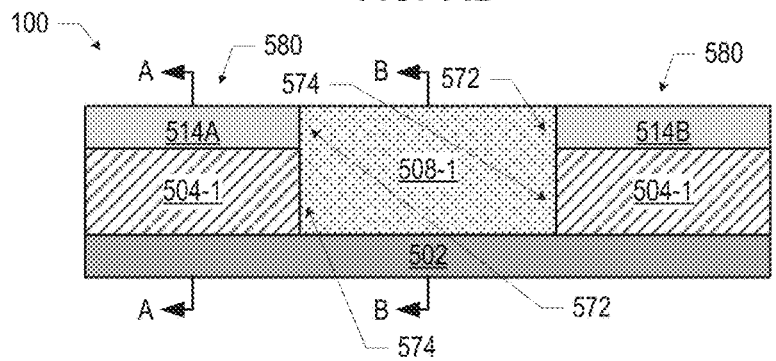
Figure 14F:
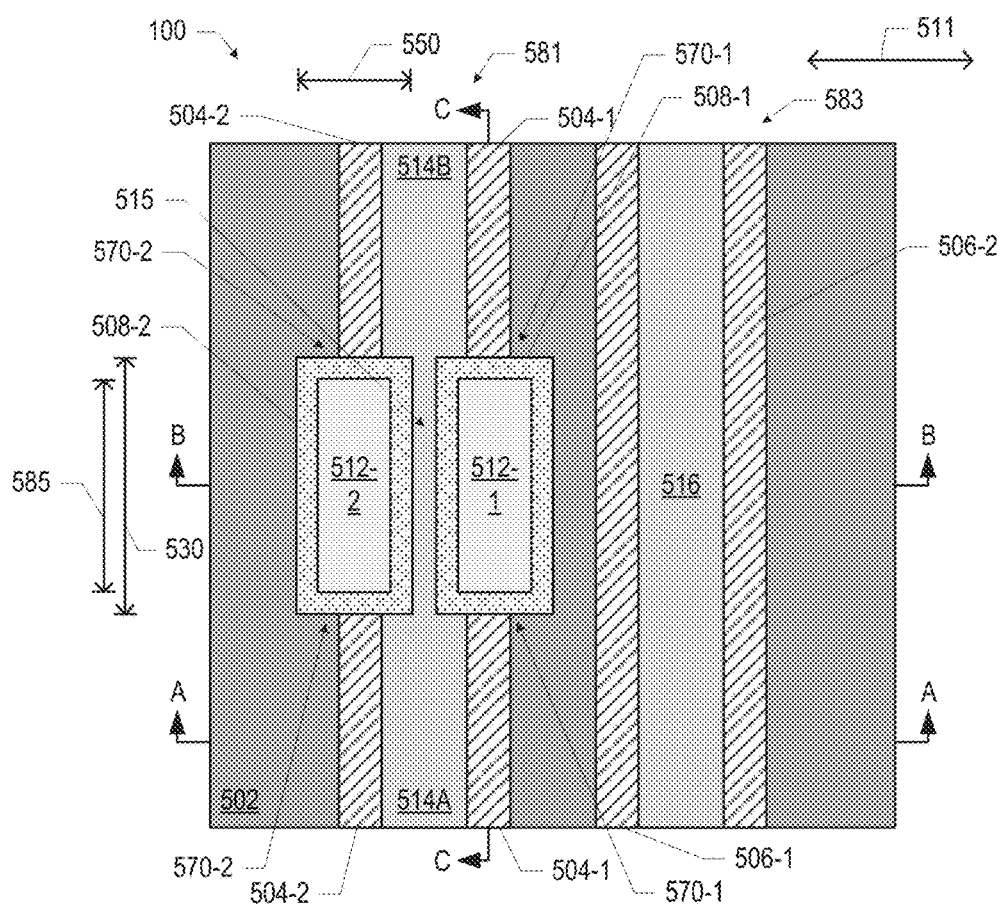

FIG. 13 depicts an assembly 624 subsequent to providing additional insulator 510 in the recess 536 of the assembly 622 (FIG. 12) above the island 512. The additional insulator 510 may be provided using any of the techniques discussed above with reference to FIG. 7. The assembly 624 may take the form of the SET device 100 discussed above with reference to FIG. 1. In some embodiments, the additional insulator 510 may extend beyond the recess 536, and may be deposited over all of the assembly 622; this is not shown in FIG. 13 for economy of illustration. Conductive pathways (including, e.g., conductive vias, not shown) may extend through the insulator 510 to make contact with the S/D electrodes 504 and the gate electrode 506.

FIG. 14 provides various views of a second embodiment of a SET device 100. In particular, FIG. 14A is a cross-sectional view of the SET device 100 through the section A-A of FIGS. 14C, 14E, and 14F; FIG. 14B is a cross-sectional view of the SET device 100 through the section B-B of FIGS. 14C, 14E, and 14F; FIG. 14C is a cross-sectional view of the SET device 100 through the section C-C of FIGS. 14A, 14B, 14D, and 14F; FIG. 14D is a side view of the SET device 100 toward the section A-A with the insulator 510 removed; FIG. 14E is a side view of the SET device 100 toward the section C-C from the gate electrode 506-1 with the insulator 510 removed; and FIG. 14F is a top view of the SET device 100 with the insulator 510 removed. As discussed below, FIG. 14 depicts one complete SET, and two "halves" of additional SETs 100.

As illustrated in FIG. 14, the SET device 100 may include an S/D structure 581 including two source/drain (S/D) supports 514A and 514B disposed on a substrate 502. The S/D structure 581 may also include support material 515 between the S/D supports 514A and 514B. In some embodiments, the S/D supports 514A and 514B and the support material 515 may be materially contiguous (e.g., as discussed below with reference to FIGS. 15-16). Reference to an "S/D support 514" may refer to both the S/D supports 514A and 514B. Each S/D support 514 may have an S/D electrode 504-1 disposed on a side face 562 of the S/D support 514. Two S/D electrodes 504-1 of the S/D structure 581 may be spaced apart by intervening dielectric 508-1 and an island 512-1. In particular, a SET may include two TJs 570-1, each formed by a portion of dielectric 508-1 "sandwiched" between an S/D electrode 504-1 and the island 512-1.

A gate structure 583 including a gate support 516 may also be disposed on the substrate 502. The gate structure 583 may also include a gate electrode 506-1 disposed on a side face 568 of the gate support 516. During use, as discussed above with reference to FIG. 1, voltages may be applied to the gate electrode 506-1 and the S/D electrodes 504-1 to control electron transport and electron occupancy in the island 512-1; the gate electrode 506-1, the S/D electrodes 504-1, the dielectric 508-1, and the island 512-1 may thus together provide a SET.

FIG. 14 also illustrates portions of additional SETs. In particular, the S/D structure 581 may include additional S/D electrodes 504-2 disposed on the side faces 564 of the S/D supports 514 (opposite to the side faces 562). The two S/D electrodes 504-2 may be spaced apart by intervening dielectric 508-2 and an island 512-2. In particular, this arrangement may result in two TJs 570-2, each formed by a portion of dielectric 508-2 "sandwiched" between an S/D electrode 504-2 and the island 512-2. Similarly, the gate structure 583 may include an additional gate electrode 506-2 disposed on the side face 566 of the gate support 516 (opposite to the side face 568). If the S/D structures 581 and the gate structures 583 of FIG. 14 are repeatedly alternatingly arranged (continuing the pattern illustrated in FIG. 14), the gate electrode 506-2 of an additional gate structure 583 (not shown) disposed to the "left" of the S/D structure 581 of FIG. 14F may, together with the S/D electrodes 504-2, the dielectric 508-2, and the island 512-2, provide another SET. In this manner, an array of SETs may be formed. Use of these SETs may take the form of any of the embodiments disclosed herein.

Reference to a "dielectric 508" may refer to both the dielectrics 508-1 and 508-2, and reference to an "island 512" may refer to both the islands 512-1 and 512-2. Similarly, reference to an "S/D electrode 504" may refer to both the S/D electrodes 504-1 and 504-2, and reference to a "gate electrode 506" may refer to both the gate electrodes 506-1 and 506-2.

The dielectrics 508 of FIG. 14 may extend up the sidewalls 572 of the S/D supports 514, and up the sidewalls 574 of the S/D electrodes 504. In some embodiments, the dielectrics 508 may extend along the substrate 502 between the S/D supports 514 and the S/D electrodes 504 such that a portion of the dielectrics 508 is disposed between the islands 512 and the substrate 502. The dielectrics 508 may also extend up sidewalls 576 of the insulator 510, as shown.

The islands 512 of FIG. 14 may be disposed at the bottom of the "boxes" formed by the dielectrics 508. In some embodiments, the top faces 578 of the islands 512 may be recessed back from the top faces 580 of the S/D supports 514; in some such embodiments, portions of the insulator 510 may be disposed in the "boxes" formed by the dielectrics 508 such that the islands 512 are disposed between these portions of the insulator 510 and the substrate 502.

In some embodiments, the top faces 582 of the S/D electrodes 504 of FIG. 14 may be recessed back from the top faces 580 of the S/D supports 514. Similarly, in some embodiments, the top faces 584 of the gate electrodes 506 may be recessed back from the top face 586 of the gate support 516. The dimensions 524, 588, 526, 522, 518, 590, 520, 530, 585, and 587 of FIG. 14 may take any of the forms discussed above with reference to the SET device 100 of FIG. 1.

As illustrated in FIG. 14, in some embodiments, the dielectrics 508 may laterally extend beyond the area between the two S/D supports 514 (e.g., in the dimension indicated by the arrow 511). The dielectrics 508 may also laterally extend beyond the area between the two S/D electrodes 504. Similarly, in some embodiments, the islands 512 may laterally extend beyond the area between the two S/D supports 514, and the islands 512 may laterally extend beyond the area between the two associated S/D electrodes 504. In some embodiments, the dielectric 508 may have a lateral dimension 550 (perpendicular to the axis between the S/D electrodes 504) between 10 and 50 nanometers (e.g., 20 nanometers).

Any suitable materials discussed above with reference to the SET device 100 of FIG. 1 may be used in the SET device 100 of FIG. 14. Additionally, although a single complete SET is illustrated in FIG. 14 (and a one-dimensional array of the SETs of FIG. 14 is discussed above), a device may include a two-dimensional array of the SETs illustrated in FIG. 14 (or any other arrangement of multiple SETs).

Any suitable process may be used to manufacture the SET device 100 of FIG. 14. For example, FIGS. 15-18 depict various cross-sectional views of stages in an example process for manufacturing the SET device 100 of FIG. 14. The materials and dimensions of various components of the stages illustrated in FIGS. 15-18 may take the form of any of the embodiments discussed herein. In FIGS. 15-18, the "A" sub-figures represent cross-sectional views through the section A-A (analogous to FIG. 14A), the "B" sub-figures represent cross-sectional views through the section B-B (analogous to FIG. 14B), and the "C" sub-figures represent cross-sectional views through the section C-C (analogous to FIG. 14C).

Figure 15A:
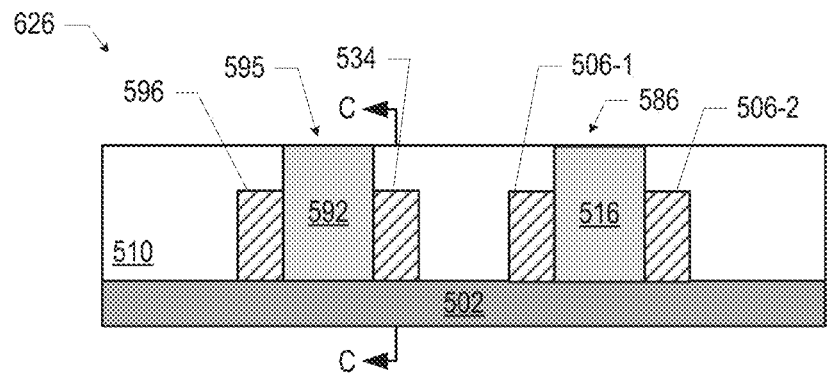
FIGS. 15A-15C, 16A-16C, 17A-17C, and 18A-18C illustrate various example stages in the manufacture of the SET device of FIGS. 14A-14F, in accordance with various embodiments.
Figure 15B:
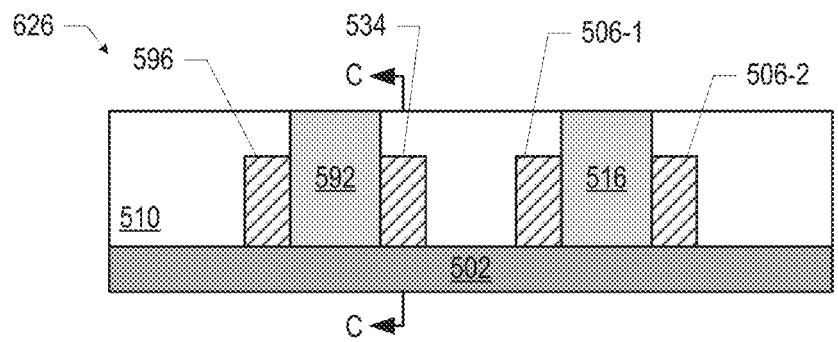
Figure 15C:
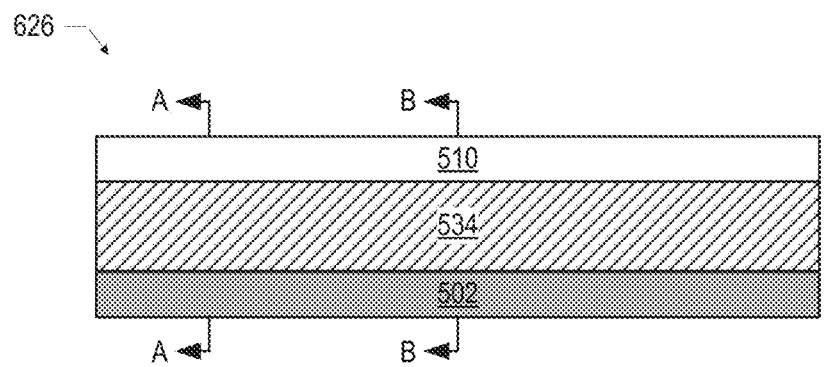

FIG. 15 depicts an assembly 626 subsequent to depositing an insulator 510 on the assembly 608 (FIG. 5). In contrast to the manufacturing process discussed above with reference to FIG. 1, the conductive material 596 disposed on the side face 597 of the support material 592 may not be removed (as discussed above with reference to FIG. 6); similarly, the conductive material 594 disposed on the side face 566 of the gate support 516 in FIG. 5 may not be removed. In FIG. 15, the conductive material 594 is relabeled as 506-2, consistent with FIG. 14, and the gate electrode 506 of FIG. 5 is relabeled as the gate electrode 506-1. In the assembly 626, the top face 595 of the support material 592 and the top face 586 of the gate support 516 are shown as exposed, but in other embodiments, the insulator 510 may extend over the top face 595 and the top face 586. In some embodiments, deposition of the insulator 510 may be followed by a polishing step in which the insulator 510 is polished to create a flat face (e.g., by chemical mechanical polishing); in some such embodiments, the top face 595 and the top face 586 may be exposed subsequent to polishing.

Figure 16A:
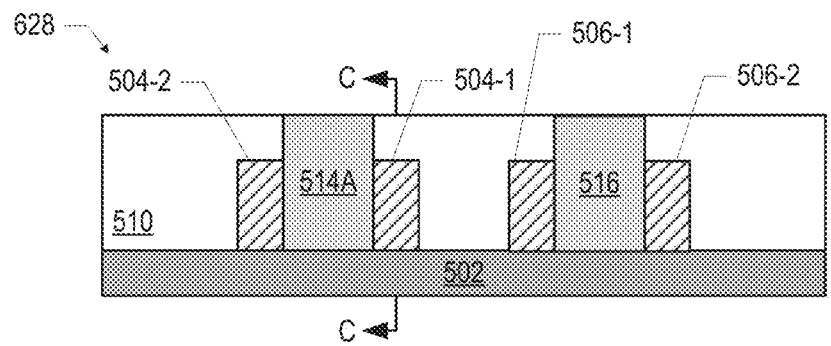
Figure 16B:
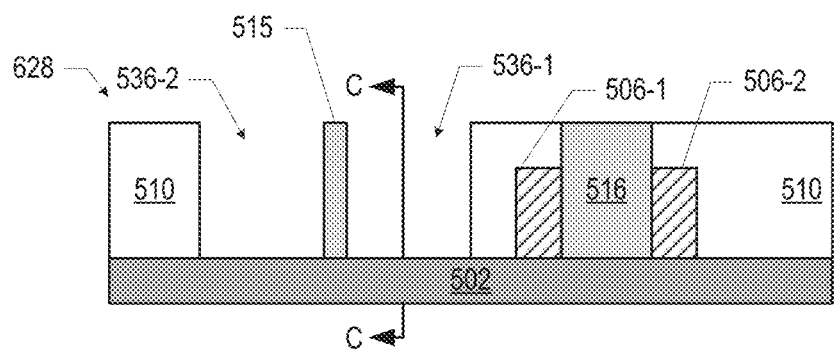
Figure 16C:
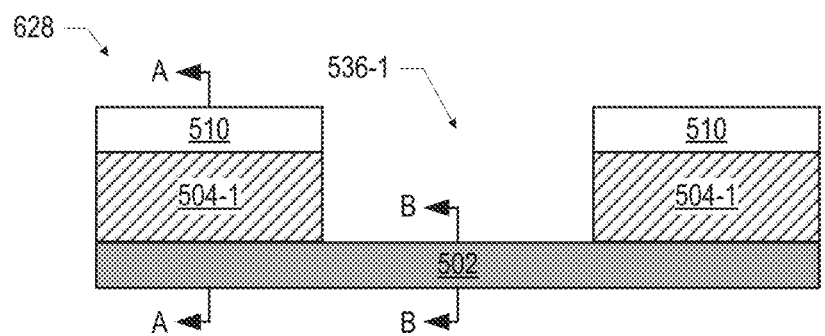

FIG. 16 depicts an assembly 628 subsequent to forming two recesses 536-1 and 536-2 in the assembly 626 (FIG. 15). Reference to a "recess 536" may refer to both the recesses 536-1 and 536-2. The recesses 536 may have the footprints of the dielectrics 508 illustrated in FIG. 14F (e.g., substantially rectangular footprints), and may divide the support material 592 of FIG. 15 into the two S/D supports 514A and 514B, joined by the support material 515. The lateral dimensions of the recesses 536 may take any of the forms of the lateral dimensions 550 and 530 discussed herein. The recess 536-1 may divide the conductive material 534 into two S/D electrodes 504-1 (disposed on the side faces 562 of the S/D supports 514), and the recess 536-2 may divide the conductive material 534 into two S/D electrodes 504-2 (disposed on the side faces 564 of the S/D supports 514). The recess 536-1 may be spaced apart from the gate electrode 506-1 by a portion of the insulator 510, as shown. The recesses 536-1 and 536-2 may be spaced apart from each other by the support material 515. The recesses 536-1 and 536-2 may be formed using any of the techniques discussed above with reference to FIG. 8.

Figure 17A:
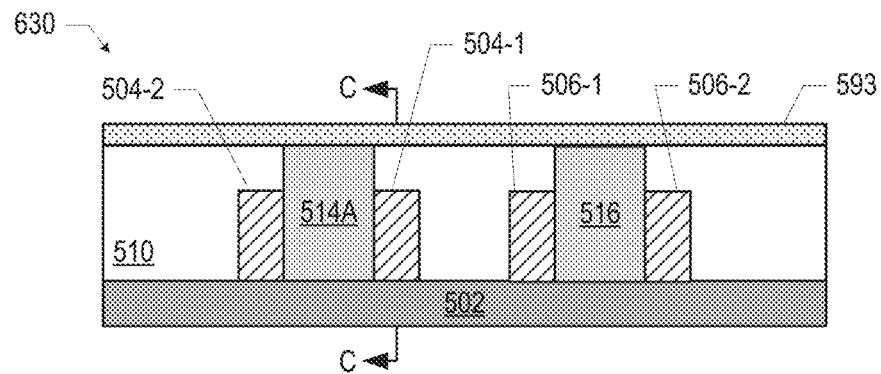
Figure 17B:
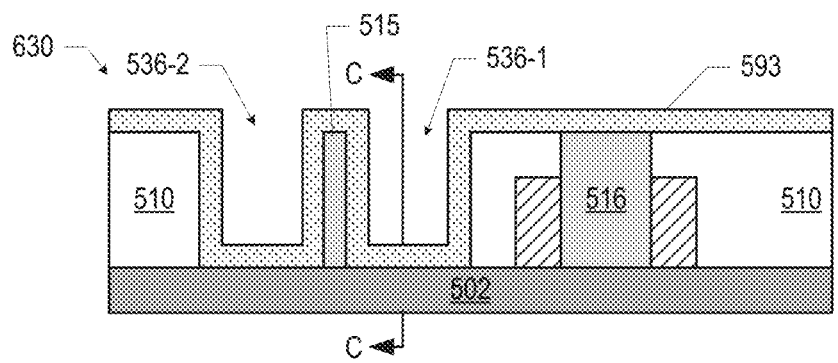
Figure 17C:
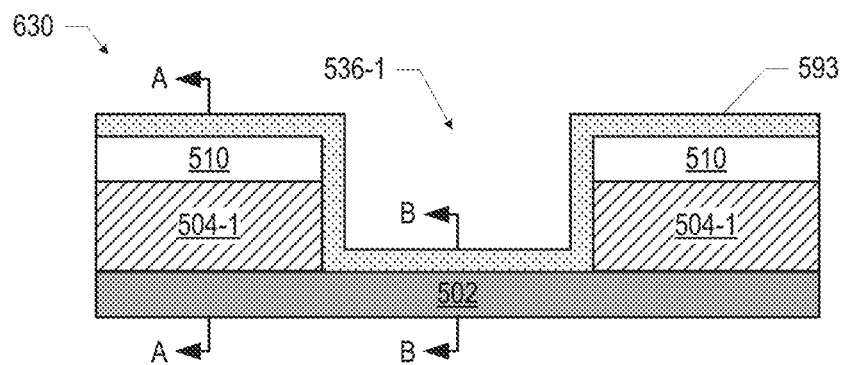

FIG. 17 depicts an assembly 630 subsequent to conformally depositing a dielectric material 593 on the assembly 628 (FIG. 16). The dielectric material 593 may be the material of the dielectrics 508, and it may be deposited on the sidewalls and bottom of the recesses 536-1 and 536-2, as shown. The thickness of the dielectric material 593 may be substantially equal to the thickness 524, discussed above. Such conformal deposition may be performed by, for example, ALD.

Figure 18A:
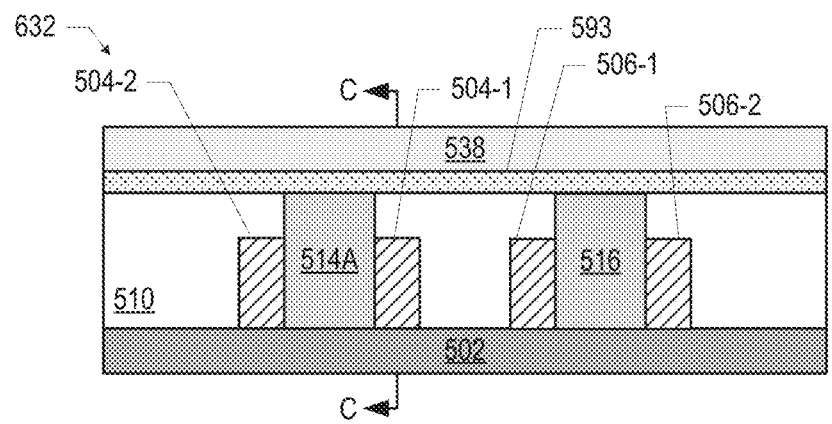
Figure 18B:
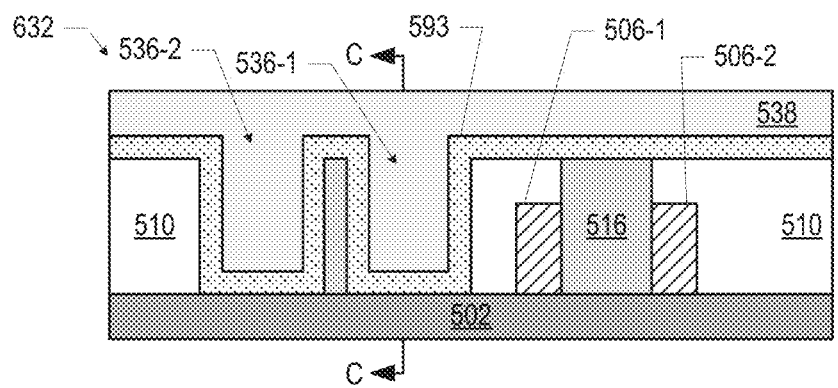
Figure 18C:
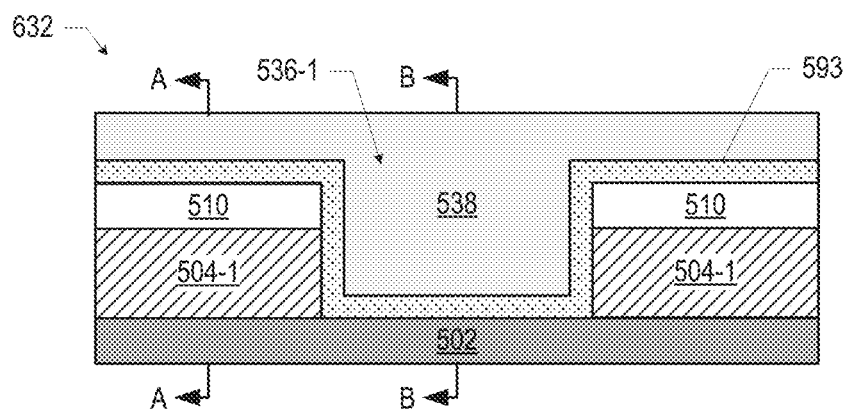

FIG. 18 depicts an assembly 632 subsequent to depositing an island material 538 on the assembly 630 (FIG. 17). The island material 538 may, as illustrated in FIG. 18, fill the recesses 536, and in some embodiments, may extend beyond the recess 536 and over the S/D supports 514 and the gate support 516. The island material 538 may be deposited using any suitable technique, such as those discussed above with reference to FIG. 10. The assembly 632 may be further processed as discussed above with reference to FIGS. 11-13 to form the SET device 100 illustrated in FIG. 14.

FIG. 19 provides various views of a third embodiment of a SET device 100. In particular, FIG. 19A is a cross-sectional view of the SET device 100 through the section A-A of FIGS. 19C, 19E, and 19F; FIG. 19B is a cross-sectional view of the SET device 100 through the section B-B of FIGS. 19C, 19E, and 19F; FIG. 19C is a cross-sectional view of the SET device 100 through the section E-E of FIGS. 19A, 19B, 19D, and 19F; FIG. 19D is a side view of the SET device 100 toward the section A-A with the insulator 510 removed; FIG. 19E is a side view of the SET device 100 toward the section E-E from the gate electrodes 506 with the insulator 510 removed; and FIG. 19F is a top view of the SET device 100 with the insulator 510 removed.

As illustrated in FIG. 19, the SET device 100 may include an S/D structure 581 including S/D electrodes 504 disposed on a substrate 502. The S/D electrodes 504 of the S/D structure 581 may be spaced apart by intervening dielectric 508 and an island 512. The S/D structure 581 may include two TJs 570, each formed by a portion of dielectric 508 "sandwiched" between an S/D electrode 504 and the island 512.

A gate structure 583 may be spaced apart from the S/D structure 581 on the substrate 502, and may include a gate electrode 506. During use, as discussed above with reference to FIG. 1, voltages may be applied to the gate electrode 506 and the S/D electrodes 504 to control electron transport and electron occupancy in the island 512; the gate electrode 506, the S/D electrodes 504, the dielectric 508, and the island 512 of FIG. 19 may thus provide a SET.

The dielectric 508 of FIG. 19 may extend up the sidewalls 574 of the S/D electrodes 504. In some embodiments, the dielectric 508 may extend along the substrate 502 between the S/D electrodes 504 such that a portion of the dielectric 508 is disposed between the island 512 and the substrate 502. The dielectric 508 may also extend up sidewalls 576 of the insulator 510, as shown.

The island 512 of FIG. 19 may be disposed at the bottom of the "box" formed by the dielectric 508. In some embodiments, the top face 578 of the island 512 may be recessed back from the top faces 582 of the S/D electrodes 504; in some such embodiments, a portion of the insulator 510 may be disposed in the "box" formed by the dielectric 508 such that the island 512 is disposed between this portion of the insulator 510 and the substrate 502.

Figure 19A:
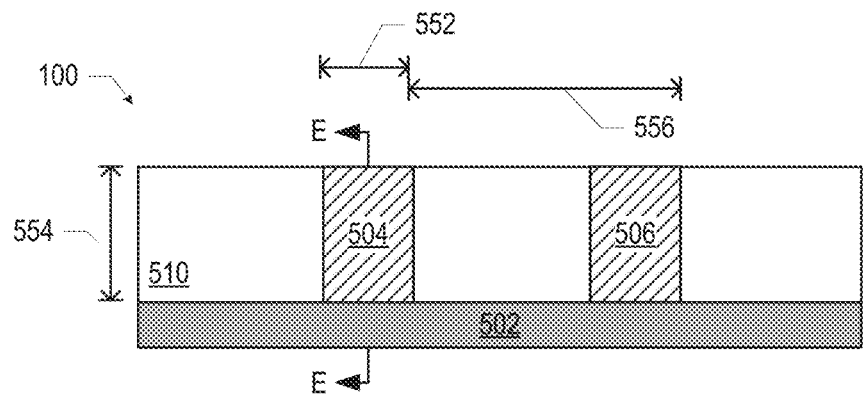
FIGS. 19A-19F are various views of another SET device, in accordance with various embodiments.
Figure 19B:
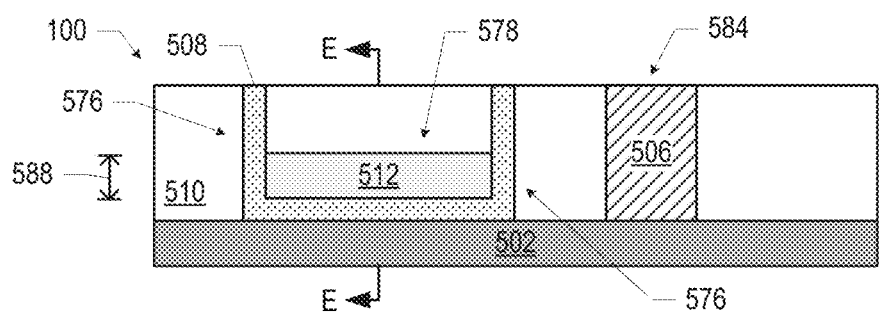
Figure 19C:
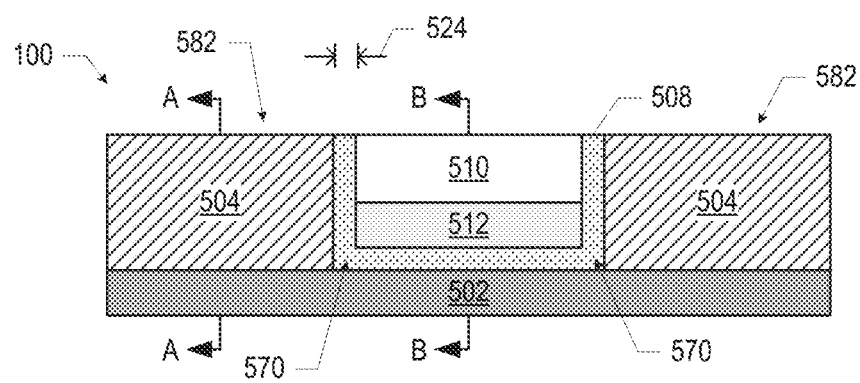
Figure 19D:
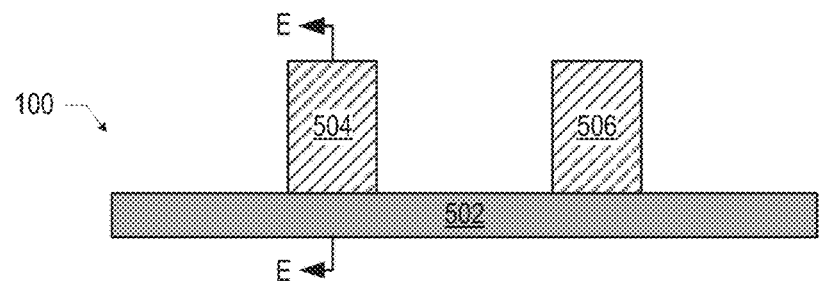
Figure 19E:
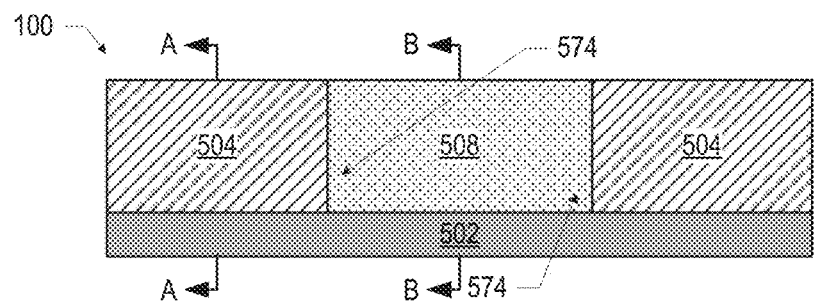
Figure 19F:
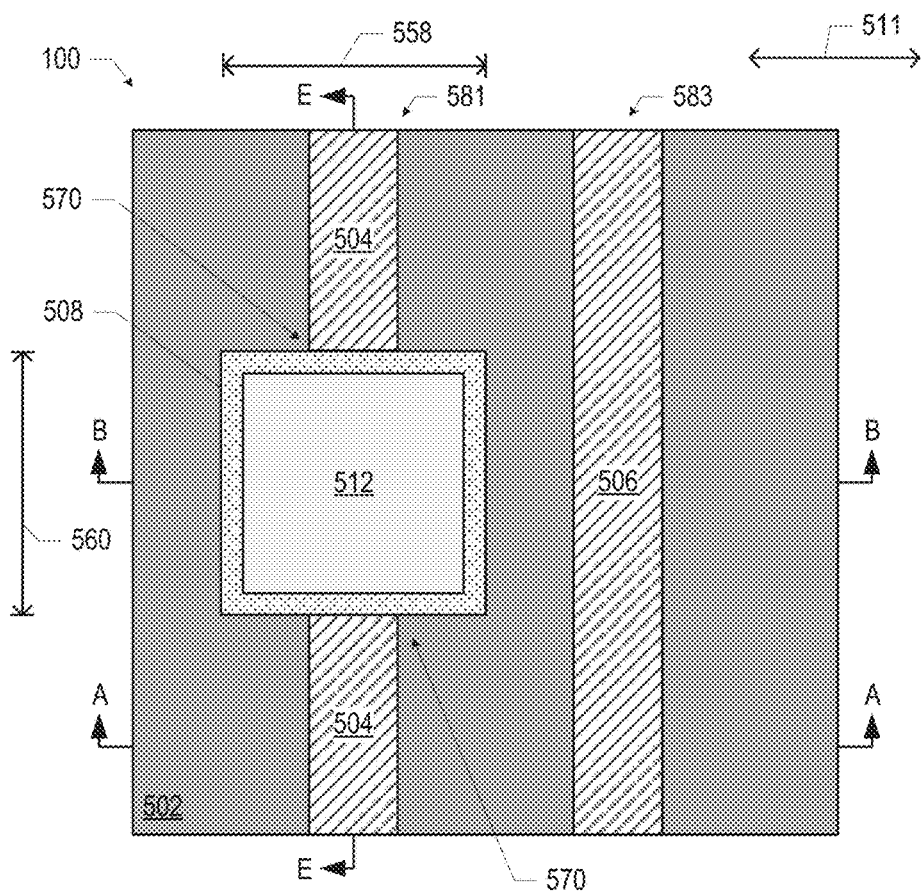

The width 552 and the height 554 of the S/D electrodes 504 may take any suitable values. For example, the width 552 may be between 20 and 80 nanometers (e.g., 40 nanometers), and the height 554 may be between 30 and 100 nanometers (e.g., 50 nanometers). The width and height of the gate electrode 506 may take the form of any of the embodiments of the width 552 and the height 554. In some embodiments, the spacing 556 of the S/D electrodes 504 and the gate electrode 506, as shown in FIG. 19A, may be between 80 and 200 nanometers (e.g., 100 nanometers). The dimensions 524 and 588 of FIG. 19 may take any of the forms discussed above with reference to the SET device 100 of FIG. 1.

As illustrated in FIG. 19, in some embodiments, the dielectric 508 may laterally extend beyond the area between the two S/D electrodes 504 (e.g., in the dimension indicated by the arrow 511). Similarly, in some embodiments, the island 512 may laterally extend beyond the area between the two S/D electrodes 504. In some embodiments, the dielectric 508 may have a lateral dimension 560 (parallel to the axis between the S/D electrodes 504) between 25 and 100 nanometers (e.g., 50 nanometers). In some embodiments, the dielectric 508 may have a lateral dimension 558 (perpendicular to the axis between the S/D electrodes 504) between 25 and 100 nanometers (e.g., 50 nanometers).

Any suitable materials discussed above with reference to the SET device 100 of FIG. 1 may be used in the SET device 100 of FIG. 19. Additionally, although a single complete SET device 100 is illustrated in FIG. 19, a device may include a one- or two-dimensional array of the SET devices 100 of FIG. 19 (or any other arrangement of multiple SET devices 100).

Figure 20A:
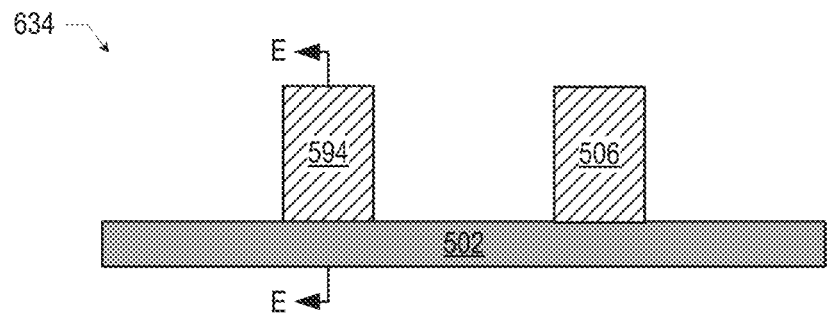
FIGS. 20A-20C, 21A-21C, and 22A-22C illustrate various example stages in the manufacture of the SET device of FIGS. 19A-19F, in accordance with various embodiments.
Figure 20B:
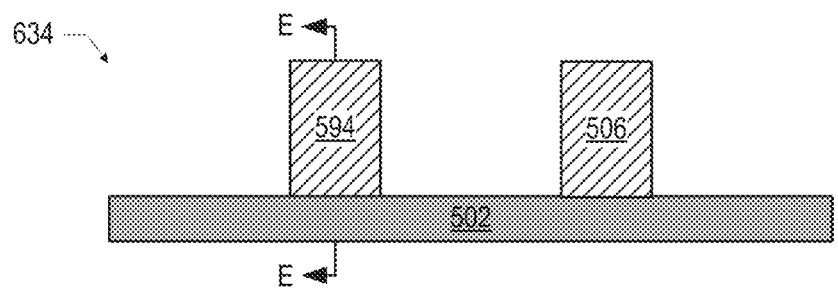
Figure 20C:
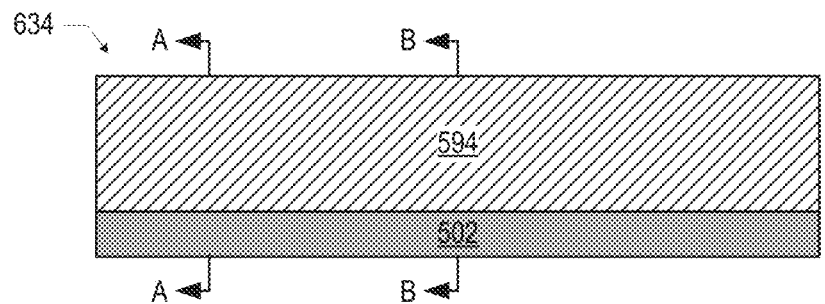
Figure 21A:
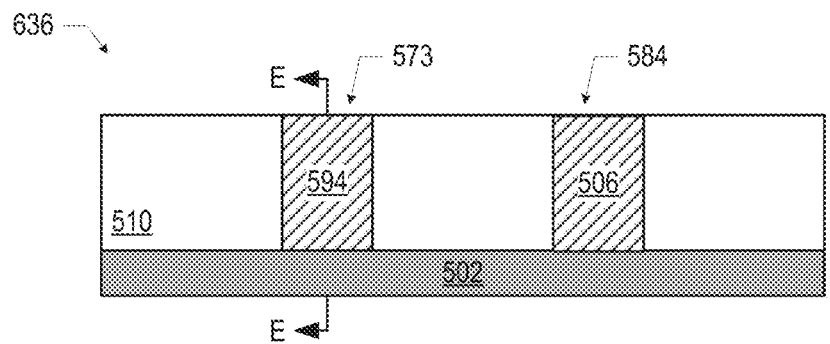
Figure 21B:
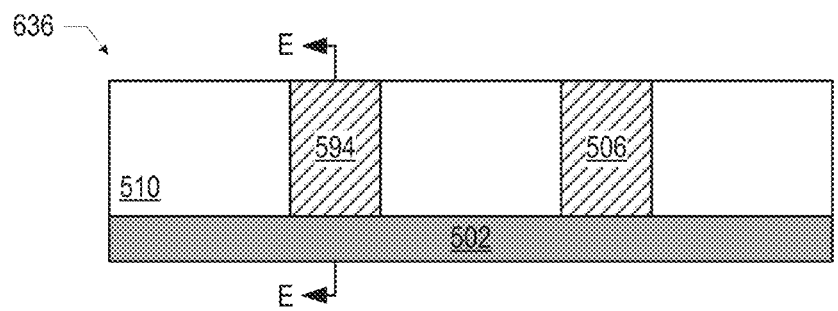
Figure 21C:
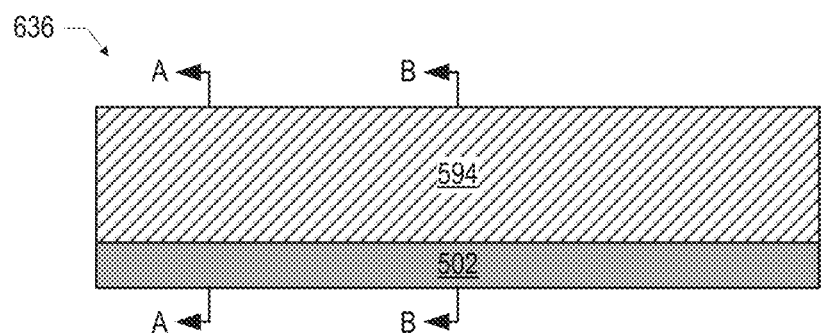
Figure 22A:
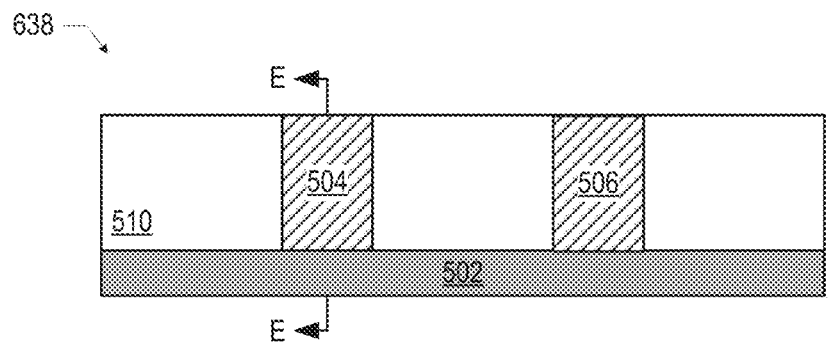
Figure 22B:
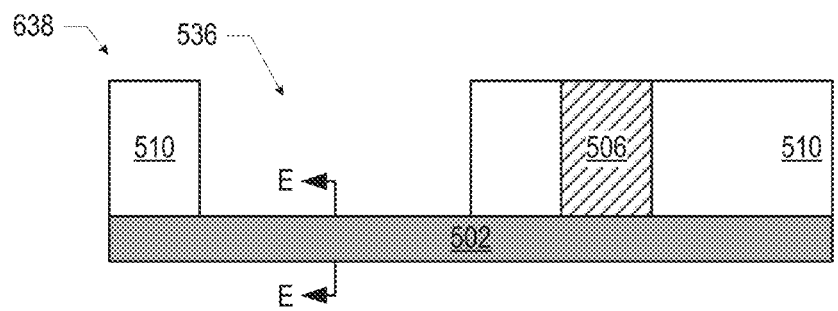
Figure 22C:
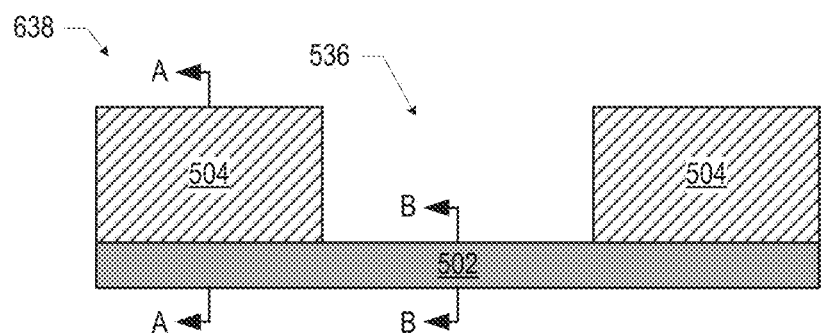
Figure 23A:
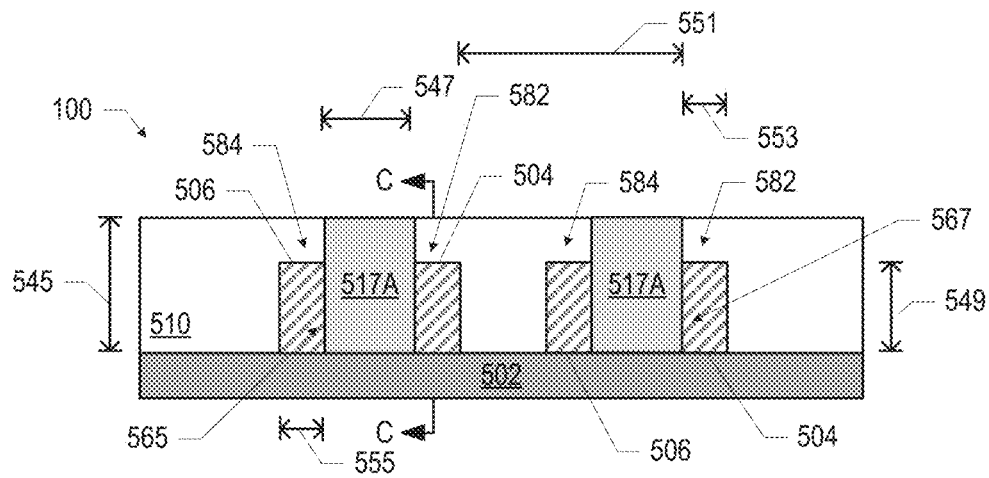
FIGS. 23A-23F are various views of another SET device, in accordance with various embodiments.
Figure 23B:
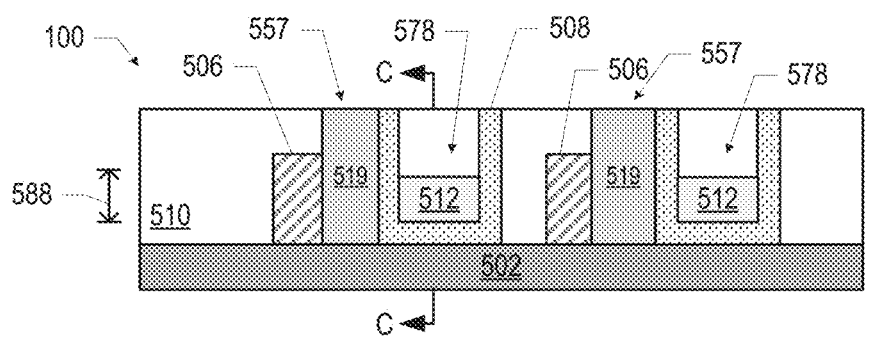
Figure 23C:
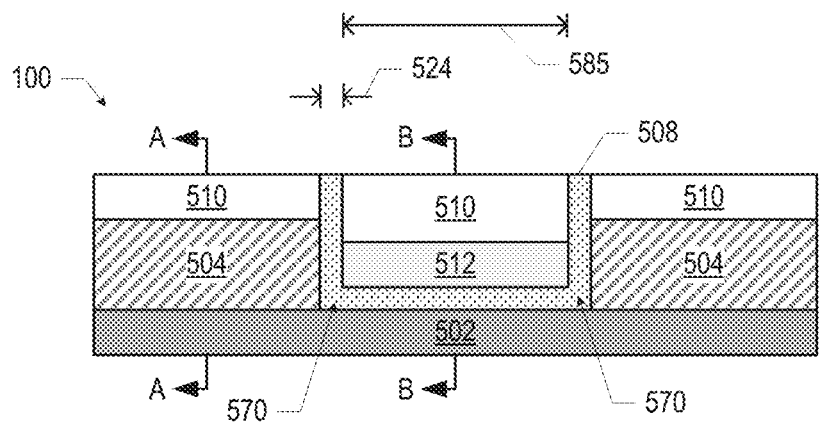
Figure 23D:
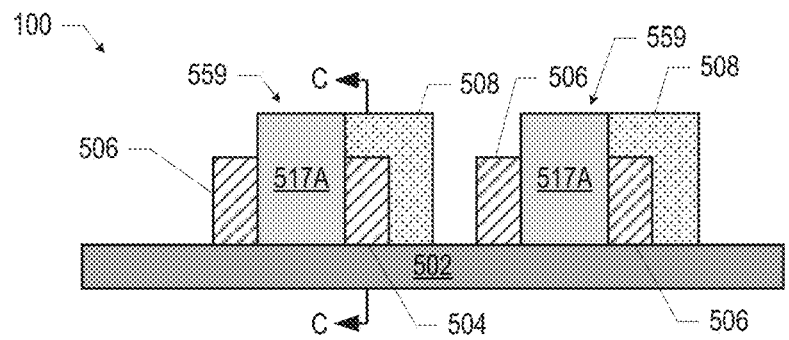
Figure 23E:
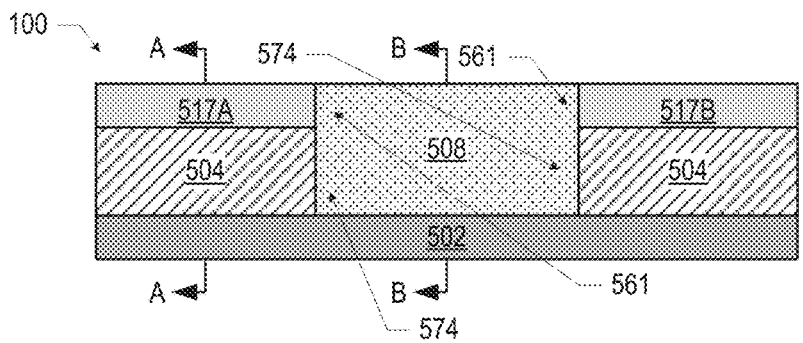
Figure 23F:
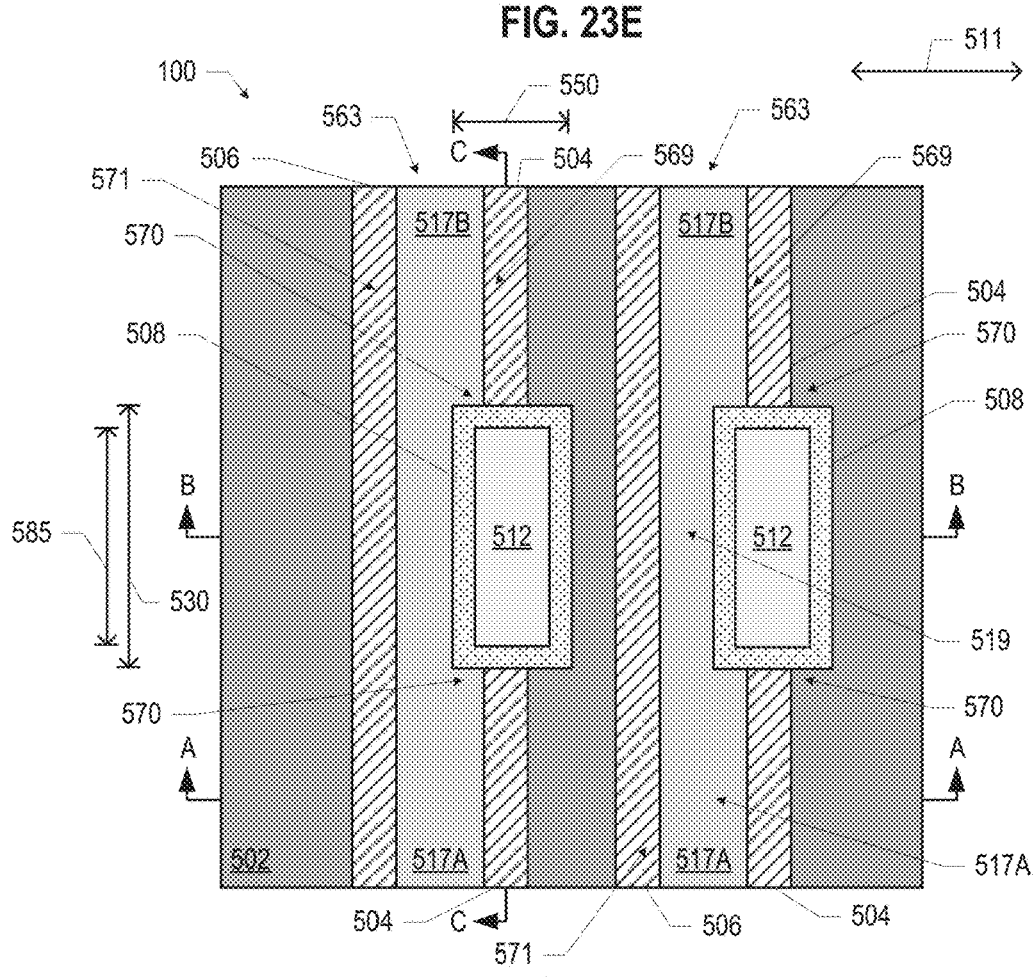

Any suitable process may be used to manufacture the SET device 100 of FIG. 19. For example, FIGS. 20-22 depict various cross-sectional views of stages in an example process for manufacturing the SET device 100 of FIG. 19. The materials and dimensions of various components of the stages illustrated in FIGS. 20-22 may take the form of any of the embodiments discussed herein. In FIGS. 20-22, the "A" sub-figures represent cross-sectional views through the section A-A (analogous to FIG. 19A), the "B" sub-figures represent cross-sectional views through the section B-B (analogous to FIG. 19B), and the "C" sub-figures represent cross-sectional views through the section E-E (analogous to FIG. 19C).

FIG. 20 depicts an assembly 634 subsequent to providing conductive material 594 and the gate electrode 506 on the substrate 502 of the assembly 602 (FIG. 2). In some embodiments, the conductive material 594 and the gate electrode 506 may each be shaped substantially as a rectangular solid. The conductive material 594 and the gate electrode 506 may each take the form of "fins" extending from the substrate 502, and may be formed using any suitable technique. For example, in some embodiments, a conductive material may be blanket-deposited on the substrate 502, and patterned to form the conductive material 594 and the gate electrode 506. In other embodiments, a sacrificial material may be blanket-deposited on the substrate 502, trenches may be formed in the sacrificial material down to the substrate 502, the trenches may be filled with conductive material to form the conductive material 594 and the gate electrode 506, and then the sacrificial material may be removed. These embodiments are simply examples, and any desired technique may be used to form the conductive material 594 and the gate electrode 506 on the substrate 502.

FIG. 21 depicts an assembly 636 subsequent to depositing an insulator 510 on the assembly 634 (FIG. 20). In the assembly 636, the top face 573 of the conductive material 594 and the top face 584 of the gate electrode 506 are shown as exposed, but in other embodiments, the insulator 510 may extend over the top face 573 and the top face 584. In some embodiments, deposition of the insulator 510 may be followed by a polishing step in which the insulator 510 is polished to create a flat face (e.g., by chemical mechanical polishing); in some such embodiments, the top face 573 and the top face 584 may be exposed subsequent to polishing.

FIG. 22 depicts an assembly 638 subsequent to forming a recess 536 in the assembly 636 (FIG. 21). The recess 536 may have the footprint of the dielectric 508 illustrated in FIG. 19F (e.g., a substantially rectangular footprint), and may divide the conductive material 594 of FIG. 21 into the two S/D electrodes 504. The lateral dimensions of the recess 536 may take any of the forms of the lateral dimensions 560 and 558 discussed herein. The recess 536 may be spaced apart from the gate electrode 506 by a portion of the insulator 510, as shown. The recess 536 may be formed using any of the techniques discussed above with reference to FIG. 8. The assembly 638 may be further processed as discussed above with reference to FIGS. 9-13 to form the SET device 100 illustrated in FIG. 19.

FIG. 23 provides various views of additional embodiments of a SET device 100. In particular, FIG. 23A is a cross-sectional view of the SET device 100 through the section A-A of FIGS. 23C, 23E, and 23F; FIG. 23B is a cross-sectional view of the SET device 100 through the section B-B of FIGS. 23C, 23E, and 23F; FIG. 23C is a cross-sectional view of the SET device 100 through the section C-C of FIGS. 23A, 23B, 23D, and 23F; FIG. 23D is a side view of the SET device 100 toward the section A-A with the insulator 510 removed; FIG. 23E is a side view of the SET device 100 toward the section C-C from the gate electrode 506 with the insulator 510 removed; and FIG. 23F is a top view of the SET device 100 with the insulator 510 removed. As discussed below, the SET device 100 of FIG. 23 may configured to so as to include two complete SETs (each provided by a gate/S/D structure 563), or one complete SET and two "halves" of additional SETs.

As illustrated in FIG. 23, the SET device 100 may include one or more gate/S/D structures 563, each including two supports 517A and 5173 disposed on a substrate 502. A gate/S/D structure 563 may also include support material 519 between the supports 517A and 5173. In some embodiments, the supports 517A and 5173 and the support material 519 may be materially contiguous (e.g., as discussed below with reference to FIG. 24). Reference to a "support 517" may refer to both the supports 517A and 5173. Two gate/S/D structures 563 are illustrated in FIG. 23, but any number of gate/S/D structures 563 may be included in a SET device 100. Each support 517 may have an S/D electrode 504 disposed on a side face 569 of the support 517. The two S/D electrodes 504 of a gate/S/D structure 563 may be spaced apart by intervening dielectric 508 and an island 512. In particular, a SET device 100 may include two TJs 570, each formed by a portion of dielectric 508 "sandwiched" between an S/D electrode 504 and the island 512. A gate/S/D structure 563 may also include a gate electrode 506 disposed on the side face 571 of the supports 517 and support material 519 (opposite to the side face 569).

The SET device 100 may be configured for use in a number of different ways. In some embodiments, the S/D electrodes 504, the island 512, and the dielectric 508 of one gate/S/D structure 563 may form a SET along with the proximate gate electrode 506 of a different adjacent gate/S/D structure 563. For example, in the embodiment shown in FIG. 23F, the "leftmost" S/D electrodes 504 and the "rightmost" gate electrode 506 (on different gate/S/D structures 563) may be used together as a SET, in any of the manners described above. In such embodiments, FIG. 23F may depict portions of additional SETs, accordingly; additional ones of the gate/S/D structures 563 may continue the linear array of FIG. 23F to provide as many complete SETs as desired. In other embodiments, the S/D electrodes 504, the island 512, the dielectric 508, and the gate electrode 506 in a single gate/S/D structure 563 may be used together as a SET. For example, in the embodiment shown in FIG. 23F, the "leftmost" S/D electrodes 504 and the "leftmost" gate electrode 506 (part of the same gate/S/D structure 563) may be used together as a SET; in such embodiments, FIG. 23F may depict two complete SETs. In either of these embodiments, an array of SETs may be formed (e.g., a one- or two-dimensional array, or any other arrangement of SETs).

The dielectric 508 of FIG. 23 may extend up the sidewalls 561 of the support 517, and up the sidewalls 574 of the S/D electrodes 504. In some embodiments, the dielectric 508 may extend along the substrate 502 between the S/D electrodes 504 such that a portion of the dielectric 508 is disposed between the islands 512 and the substrate 502. The dielectric 508 may also extend up sidewalls 576 of the insulator 510, as shown.

The island 512 of FIG. 23 may be disposed at the bottom of the "boxes" formed by the dielectric 508. In some embodiments, the top face 578 of the island 512 may be recessed back from the top face 559 of the support 517; in some such embodiments, a portion of the insulator 510 may be disposed in the "box" formed by the dielectric 508 such that the island 512 is disposed between this portion of the insulator 510 and the substrate 502.

In some embodiments, the top face 582 of the S/D electrodes 504 of FIG. 23 may be recessed back from the top face 559 of the support 517. Similarly, in some embodiments, the top face 584 of the gate electrode 506 may be recessed back from the top face 559 of the support 517. The dimensions 524, 588, 530, 550 and 585 of FIG. 23 may take any of the forms discussed above with reference to the SET device 100 of FIG. 1. The dimensions 549, 545, 547, 555, 553, and 551 may take any of the forms of the dimensions 526, 522, 518, 590, 520, and 587 disclosed herein.

As illustrated in FIG. 23, in some embodiments, the dielectric 508 may laterally extend beyond the area between the two S/D electrodes 504 of a gate/S/D structure 563 (e.g., in the dimension indicated by the arrow 511). Similarly, in some embodiments, the island 512 may laterally extend beyond the area between the two associated S/D electrodes 504.

Any suitable materials discussed above with reference to the SET device 100 of FIG. 1 may be used in the SET device 100 of FIG. 23. For example, the support 517 may be formed of any of the materials discussed above with reference to the S/D supports 514 and the gate supports 516.

Figure 24A:
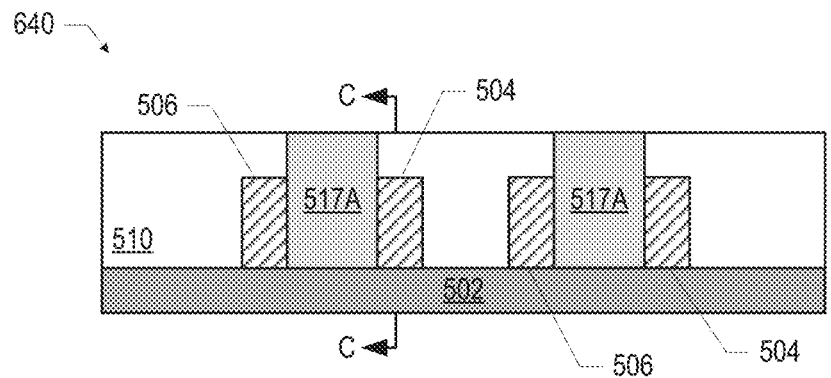
FIGS. 24A-24C illustrate an example stage in the manufacture of the SET device of FIGS. 23A-23F, in accordance with various embodiments.
Figure 24B:
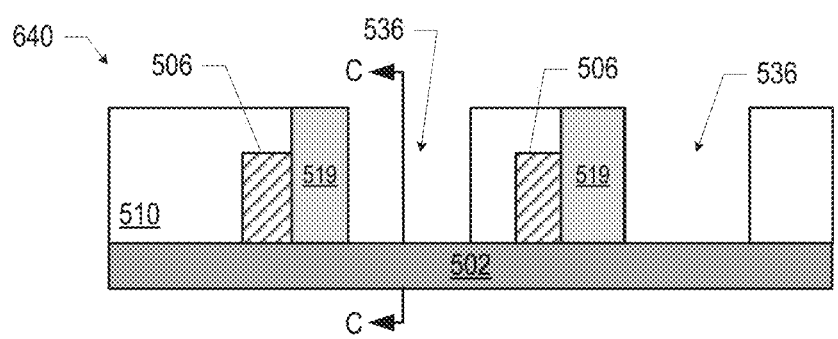
Figure 24C:
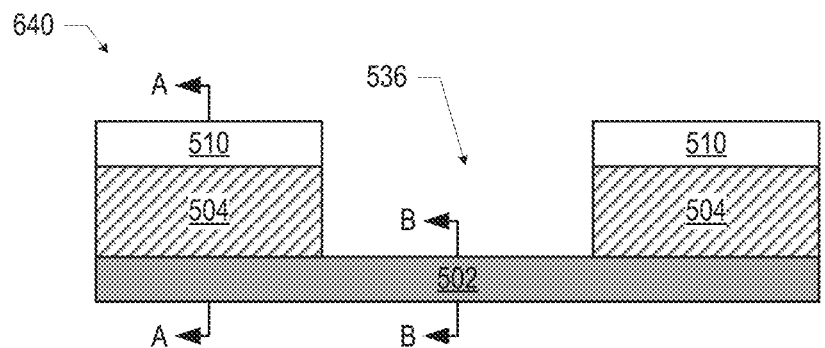

Any suitable process may be used to manufacture the SET device 100 of FIG. 23. For example, FIG. 24 depicts various cross-sectional views of a stage in an example process for manufacturing the SET device 100 of FIG. 23. The materials and dimensions of various components of the stage illustrated in FIG. 24 may take the form of any of the embodiments discussed herein. In FIG. 24, the "A" sub-figure represents a cross-sectional view through the section A-A (analogous to FIG. 23A), the "B" sub-figure represents a cross-sectional view through the section B-B (analogous to FIG. 23B), and the "C" sub-figure represents a cross-sectional view through the section C-C (analogous to FIG. 23C).

FIG. 24 depicts an assembly 640 subsequent to forming recesses 536 in the assembly 626 (FIG. 15). The recesses 536 may have the footprints of the dielectrics 508 illustrated in FIG. 23F (e.g., substantially rectangular footprints), and may divide the support material 592 of FIG. 15 into the two supports 517A and 517B, joined by the support material 519. The lateral dimensions of the recesses 536 may take any of the forms of the lateral dimensions 550 and 530 discussed herein. The recess 536 may divide the conductive material 534 into two S/D electrodes 504 (disposed on the side faces 569 of the supports 517). In FIG. 24, the conductive material 596 is relabeled as the gate electrode 506, and the gate support 516 has been relabeled as the support 517, consistent with FIG. 23. The recess 536 may be spaced apart from the gate electrode 506 by the support material 519, as shown, and a recess 536 of one gate/S/D structure 563 (not labeled in FIG. 24) may be spaced apart by a proximate gate electrode 506 of another gate/S/D structure 563 by a portion of the insulator 510, as shown. The recesses 536 may be formed using any of the techniques discussed above with reference to FIG. 8. The assembly 640 may be further processed as discussed above with reference to FIGS. 17-18 and/or 9-13 to form the SET device 100 illustrated in FIG. 23.

Figure 25:
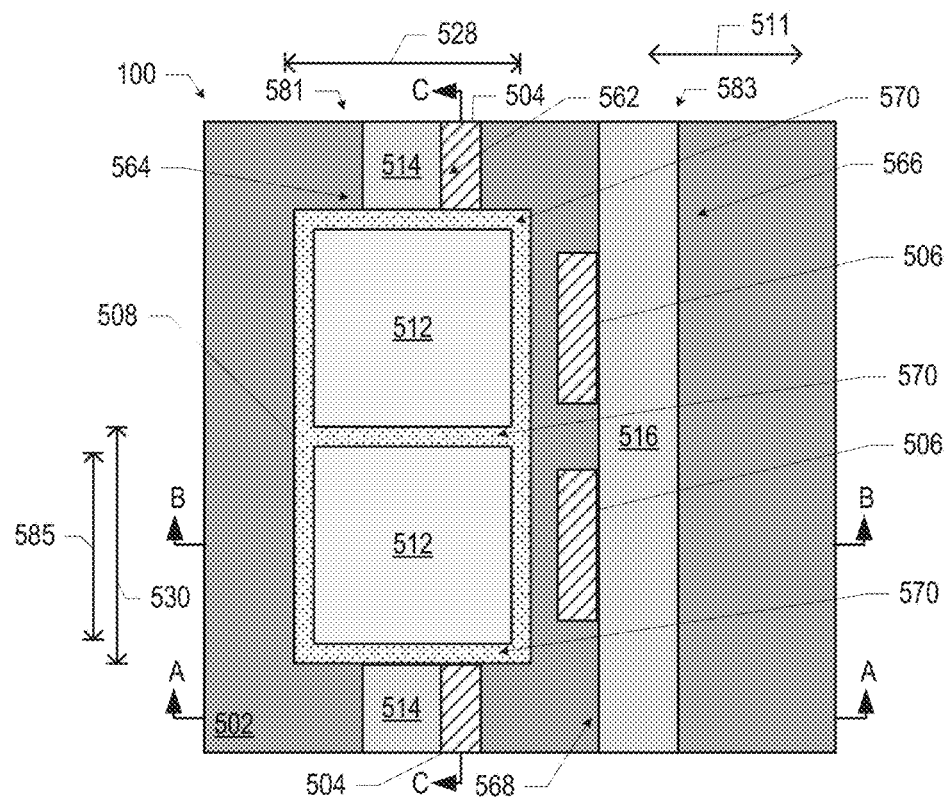
FIGS. 25-28 are examples of multi-island SET devices, in accordance with various embodiments.
Figure 26:
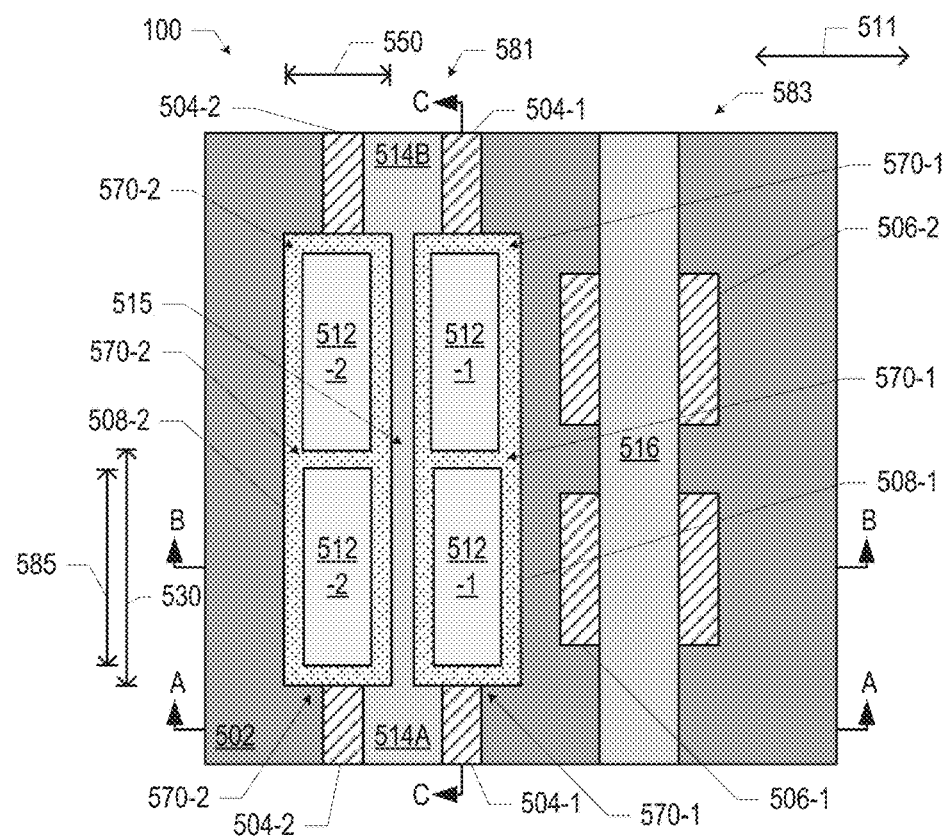
Figure 27:
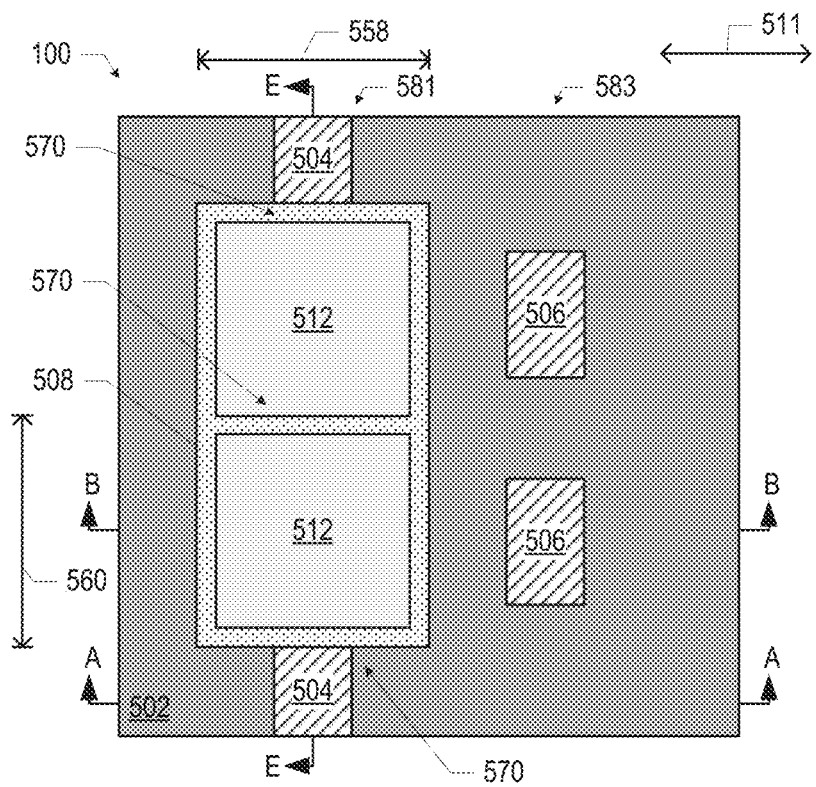
Figure 28:
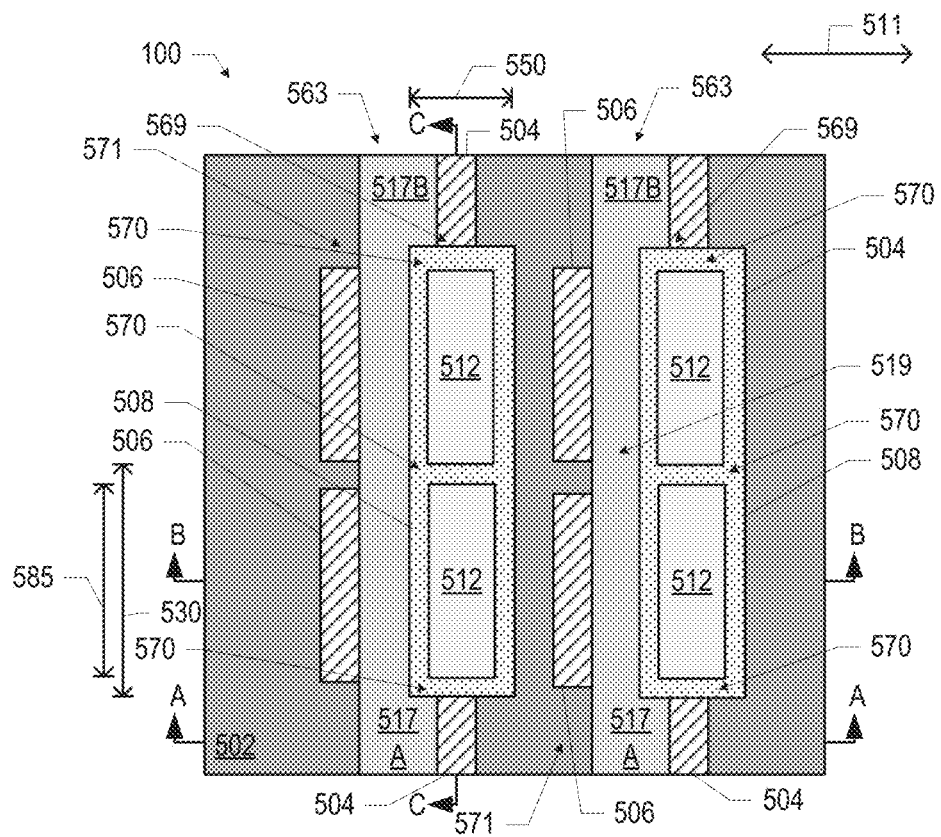

In some embodiments, a SET device 100 may include multiple islands 512, and thus more than two TJs 570 (and thus may be a "multiple-dot SET"). For example, FIG. 25 illustrates an embodiment of a SET device 100 whose structure is similar to that of the SET device 100 of FIG. 1 (in particular, the view illustrated in FIG. 25 is a same view as that of FIG. 1F) but that includes two islands 512 instead of one island 512 (and also includes two gate electrodes 506). FIG. 26 illustrates an embodiment of a SET device 100 whose structure is similar to that of the SET device 100 of FIG. 14 (in particular, the view illustrated in FIG. 26 is a same view as that of FIG. 14F) but that includes four islands 512 instead of two islands 512 (and also includes four gate electrodes 506). FIG. 27 illustrates an embodiment of a SET device 100 whose structure is similar to that of the SET device 100 of FIG. 19 (in particular, the view illustrated in FIG. 27 is a same view as that of FIG. 19F) but that includes two islands 512 instead of a single island 512 (and also includes two gate electrodes 506). FIG. 28 illustrates an embodiment of a SET device 100 whose structure is similar to that of the SET device 100 of FIG. 23 (in particular, the view illustrated in FIG. 28 is a same view as that of FIG. 23F) but that includes four islands 512 instead of two islands 512 (and also includes four gate electrodes 506).

Although the SET devices 100 illustrated in FIGS. 25-28 include "twice" as many islands 512 and gate electrodes 506 as illustrated in their counterpart embodiments (in FIGS. 1, 14, 19, and 23, as noted above), this is simply for economy of illustration, and any SET device 100 may include more than "twice" as many islands 512 and gate electrodes 506; for example, a SET device 100 may include three or more islands 512, in accordance with the present disclosure (e.g., as discussed below with reference to FIG. 32). The dimensions and materials of the SET devices 100 illustrated in FIGS. 25-28 may take the form of any of the embodiments of the dimensions and materials, respectively, discussed herein with reference to their counterpart embodiments (in FIGS. 1, 14, 19, and 23, as noted above).

Figure 29A:
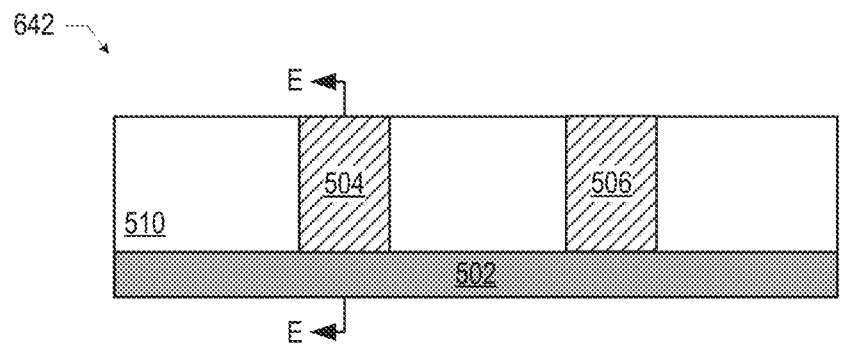
FIGS. 29A-29C and 30A-30C illustrate various example stages in the manufacture of the multi-island SET device of FIG. 27, in accordance with various embodiments.
Figure 29B:
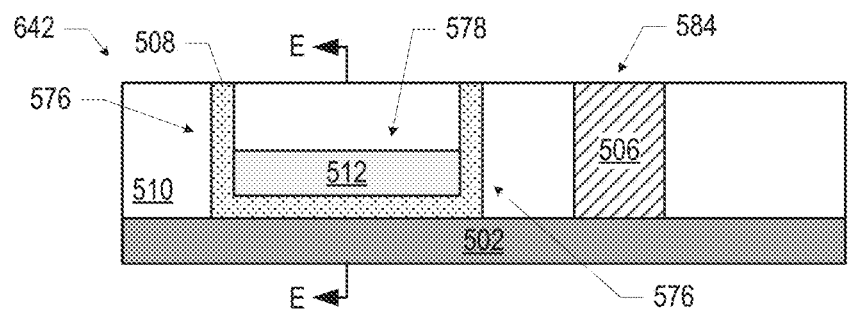
Figure 29C:
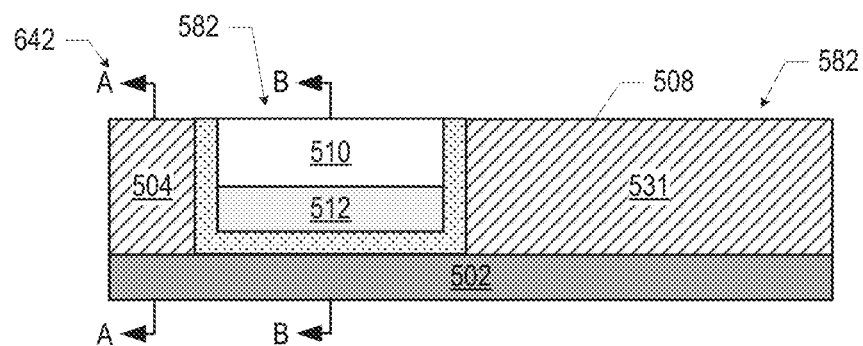
Figure 30A:
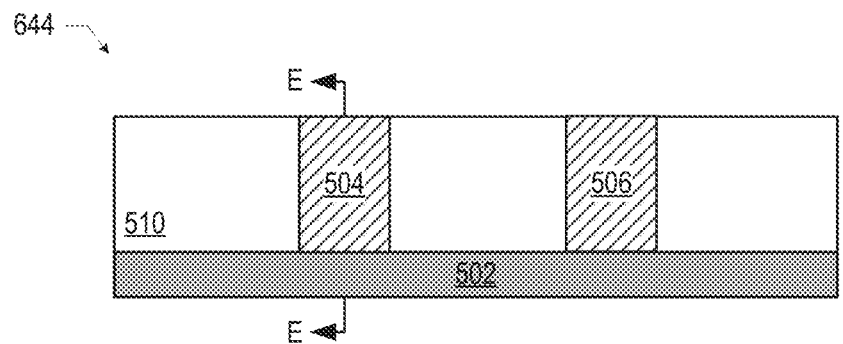
Figure 30B:
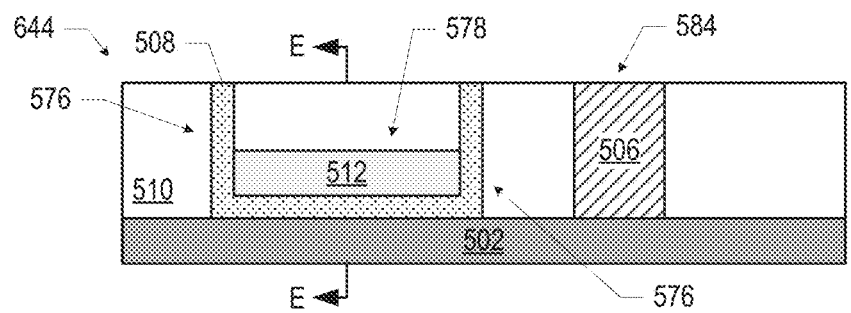
Figure 30C:
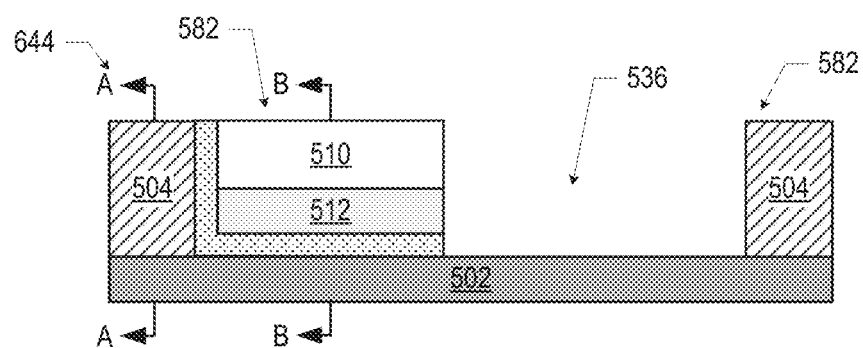

Any suitable process may be used to manufacture the SET devices 100 of FIGS. 25-28. For example, FIGS. 29 and 30 depict various cross-sectional views of stages in an example process for manufacturing the SET device 100 of FIG. 27. The materials and dimensions of various components of the stages illustrated in FIGS. 29 and 30 may take the form of any of the embodiments discussed herein. Moreover, the techniques illustrated in FIGS. 29 and 30 for forming multiple adjacent islands 512 in a SET device 100 may be used to form the multiple islands 512 in any of the SET devices 100 of FIGS. 25-28. In FIGS. 29 and 30, the "A" sub-figure represents a cross-sectional view through the section A-A, the "B" sub-figure represents a cross-sectional view through the section B-B, and the "C" sub-figure represents a cross-sectional view through the section E-E.

FIG. 29 depicts an assembly 642 subsequent to forming a first island 512, as discussed above with reference to FIGS. 19-22. The gate electrodes 506 in the assembly 642 may be patterned separately from the patterning and formation of the first island 512, or may be patterned along with the patterning performed for the first island 512 (or a subsequent island 512, as discussed below). The assembly 642 may include one S/D electrode 504 and one portion of conductive material 531.

FIG. 30 depicts an assembly 644 subsequent to forming a recess 536 in the assembly 642 (FIG. 29). Forming the recess 536 may include removing a portion of the dielectric 508 on the side face of the island 512, as shown, as well as removing some of the conductive material 531 of the assembly 642 to form a second S/D electrode 504. The recess 536 may be formed using any of the techniques discussed above with reference to FIG. 8. The assembly 644 may be further processed as discussed above with reference to FIGS. 17-18 and/or 9-13 to form the SET device 100 illustrated in FIG. 27 (e.g., providing a layer of the dielectric 508 in the recess 536, filling the remainder of the recess 536 with conductive material for another island 512, etc.). In embodiments in which more than two islands 512 are to be included in an array of adjacent islands 512 in a SET device 100, "odd-numbered" ones of the islands 512 may be formed simultaneously as discussed above with reference to FIG. 29, and then the "even-numbered" ones of the islands 512 may be filled in between the odd-numbered ones of the islands 512 using the techniques discussed with reference to FIG. 30. For example, in a SET device 100 including three islands 512 in an adjacent array (e.g., as discussed below with reference to FIG. 32), the first and third islands 512 in the array may be formed simultaneously (e.g., by forming and filling two distinct recesses 536 simultaneously, as discussed above with reference to FIGS. 8-11), and then the second island 512 (between the first and third islands 512) may be subsequently formed (e.g., by forming an additional recess 536 between the first and third islands 512, and filling that recess as discussed above with reference to FIGS. 8-11).

Although FIGS. 29 and 30 depict the second island 512 being formed after the material for the first island 512 has been provided and recessed, this need not be the case; in some embodiments, the material for the first island 512 may be provided in a first recess 536 (after a first round of dielectric 508), then the second recess 536 may be formed (e.g., as discussed above with reference to FIG. 30) and filled with dielectric 508 and material for the second island 512; subsequently, both islands 512 may be recessed and polished, as desired.

During operation of a SET including multiple islands 512, voltages may be applied independently to the different gate electrodes 506 associated with each of the different islands 512, to control the conductance of the islands 512 and the carrier occupancy in the islands 512.

In some embodiments, any of the SET devices 100 disclosed herein may be used to generate quantum dots for quantum computations, and thus may be used to generate qubits in a quantum computing device. For example, an electron may be confined in an island 512, and the spin of the electron may be used as a qubit state (or as part of a qubit state) for quantum computations. Thus, any of the SET devices 100 disclosed herein may be used in a computing device as detector devices (to detect the state of spin-based qubits), qubit devices (to provide spin-based qubits), or both. When a SET device 100 is used as a qubit in a quantum computing device (e.g., instead of as a detector), the island 512 may be preferably formed of a semiconductor material.

Figure 31:
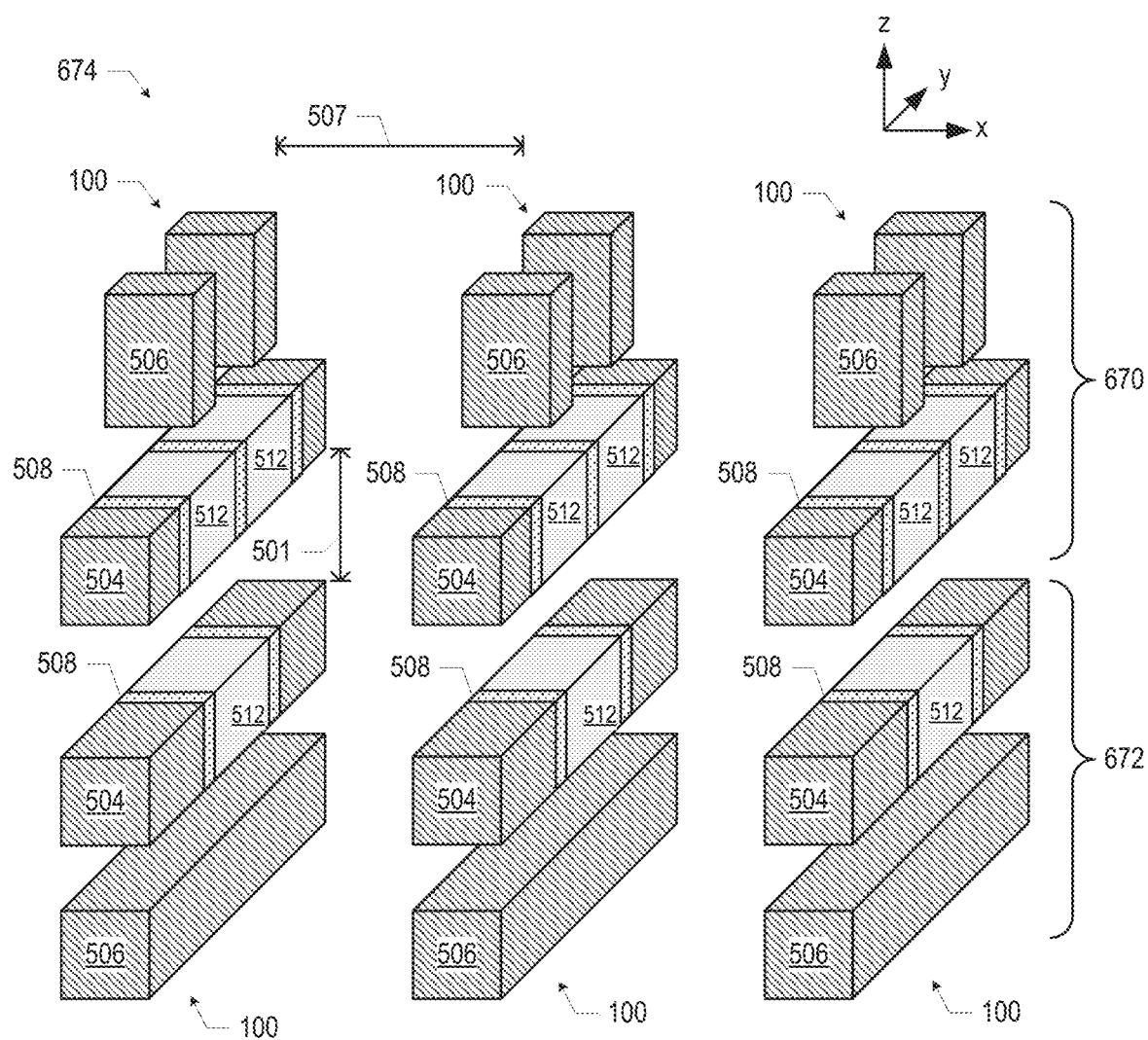
FIGS. 31 and 32 are perspective views of example qubit-detector arrangements, in accordance with various embodiments.
Figure 32:
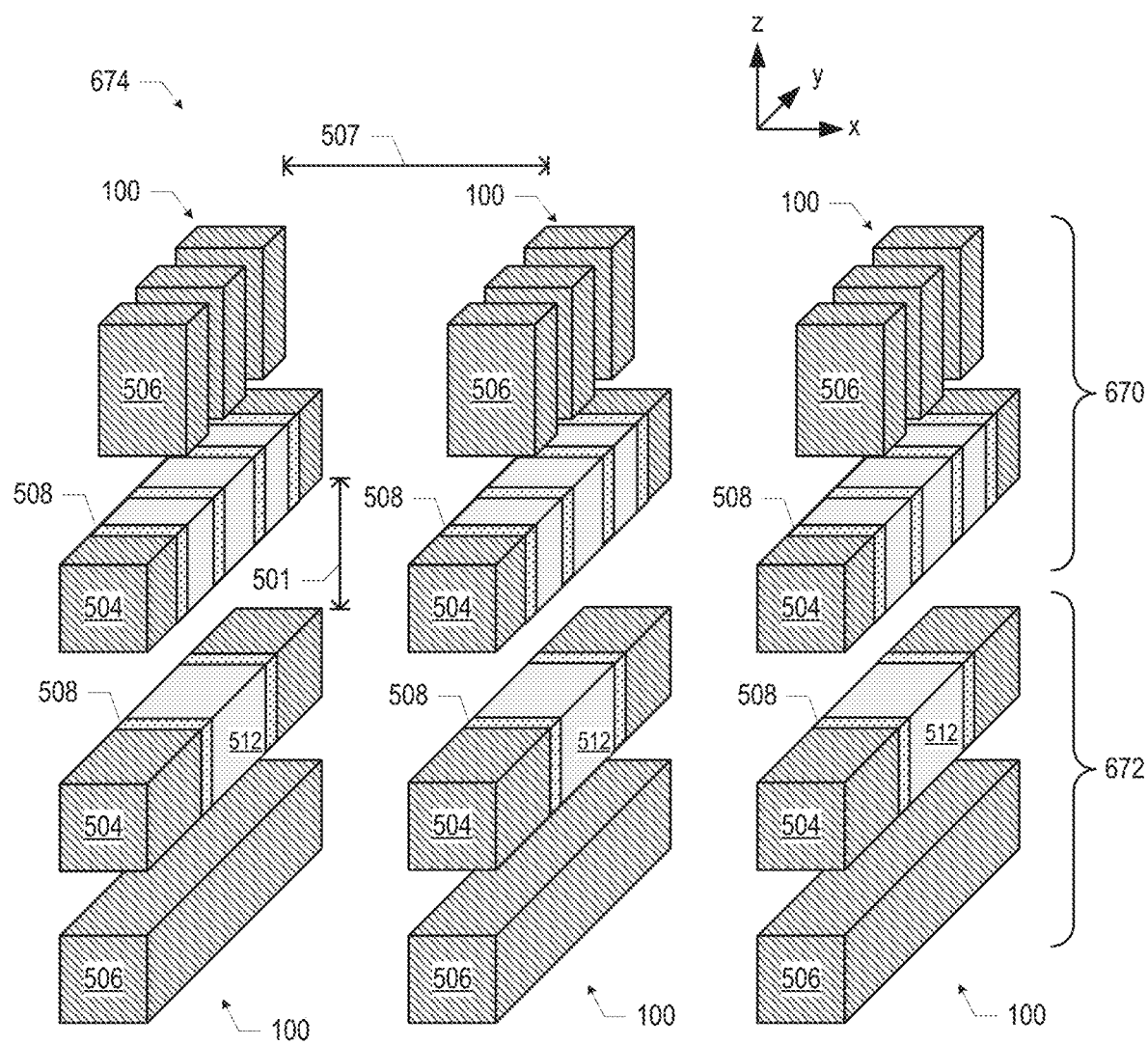

FIGS. 31 and 32 are perspective views of example qubit-detector arrangements 674, in accordance with various embodiments. In a qubit-detector arrangement 674, one or more qubit devices 670 may be proximate to one or more detectors 672 such that the detectors 672 can detect the quantum state of the qubits generated by the qubit devices 670. In some embodiments, a single detector 672 may be used to sense the quantum state of a single quantum dot formed by a qubit device 670. In other embodiments, a single detector 672 may be used to sense the quantum state of more than one quantum dot formed by one or more qubit devices 670; for example, a single detector 672 may be used to sense the quantum state of two quantum dots, or three quantum dots. In some embodiments, some or all of the qubit devices 670 and some or all of the detectors 672 may be SET devices 100. FIGS. 31 and 32 illustrate particular examples of SET devices 100 in qubit-detector arrangements 674, but any of the SET devices 100 disclosed herein may be included in a qubit-detector arrangement as shown in FIGS. 31 and 32 and described herein.

In the qubit-detector arrangement 674 of FIG. 31, three SET devices 100 provide the qubit devices 670. Each SET device includes two islands 512 spaced apart by dielectric 508, and the islands 512 are spaced apart from S/D electrodes 504 by dielectric 508 (yielding three TJs 570, not indicated, in each SET device 100). Each island 512 may be capacitively coupled to, and controlled by, a different gate electrode 506, as shown. In the embodiment of FIG. 31, the gate electrodes 506 are spaced apart from their associated islands 512 in the z-direction, while the islands 512 are arranged in an array in the y-direction. FIG. 31 also illustrates three SET devices 100 acting as detectors 672. Each detector 672 may be associated with a qubit device 670 (i.e., the qubit device 670 "above" the detector 672 in the z-direction in FIG. 31), and may be close enough to the islands 512 of the associated qubit device 670 to detect the quantum state of carriers confined in the islands 512. In some embodiments, the distance 507 between adjacent qubit devices 670 (and/or the distance between adjacent detectors 672) in the embodiment of FIG. 31 less than 200 nanometers (e.g., between 50 and 150 nanometers, or between 30 and 50 nanometers). In some embodiments, the distance 501 between a qubit device 670 and its associated detector 672 in the embodiment of FIG. 31 may be less than 200 nanometers (e.g., between 100 and 200 nanometers, between 50 and 150 nanometers, or between 50 and 100 nanometers). Thus, in the embodiment of FIG. 31, a single detector 672 may detect the quantum state of two quantum dots during operation (i.e., the quantum dots formed in the two islands 512 of the associated qubit device 670). Any desired number of the qubit devices 670 and detectors 672 illustrated in FIG. 31 may be included in a qubit-detector arrangement 674 (e.g., in a rectangular or multi-level array of detectors 672 and associated qubit devices 670).

In the qubit-detector arrangement 674 of FIG. 32, three SET devices 100 provide the qubit devices 670. Each SET device 100 may include three islands 512 spaced apart by dielectric 508, and the "end" islands 512 are spaced apart from S/D electrodes 504 by dielectric 508 (yielding four TJs 570, not indicated, in each SET device 100). Each island 512 may be capacitively coupled to, and controlled by, a different gate electrode 506, as shown. In the embodiment of FIG. 32, the gate electrodes 506 are spaced apart from their associated islands 512 in the z-direction, while the islands 512 are arranged in an array in the y-direction. FIG. 32 also illustrates three SET devices 100 acting as detectors 672. Each detector 672 may be associated with a qubit device 670 (i.e., the qubit device 670 "above" the detector 672 in the z-direction in FIG. 32), and may be close enough to the islands 512 of the associated qubit device 670 to detect the quantum state of carriers confined in the islands 512. The distances 501 and 507 may take any of the forms discussed above with reference to FIG. 32. Thus, in the embodiment of FIG. 32, a single detector 672 may detect the quantum state of three quantum dots during operation (i.e., the quantum dots formed in the three islands 512 of the associated qubit device 670). Any desired number of the qubit devices 670 and detectors 672 illustrated in FIG. 32 may be included in a qubit-detector arrangement 674 (e.g., in a rectangular or multi-level array of detectors 672 and associated qubit devices 670).

In a device, the qubit-detector arrangements 674 of FIGS. 31 and 32 may be surrounded by an insulating material (e.g., the insulator 510, not shown), and conductive pathways may contact the S/D electrodes 504 and the gate electrodes 506 in any desired manner (e.g., using known interlayer dielectric stack formation techniques).

FIGS. 33A-B are top views of a wafer 450 and dies 452 that may be formed from the wafer 450; the dies 452 may be included in any of the SET devices 100 and/or qubit-detector arrangements 674 disclosed herein. The wafer 450 may include semiconductor material and may include one or more dies 452 having conventional and SET device elements formed on a face of the wafer 450. Each of the dies 452 may be a repeating unit of a semiconductor product that includes any suitable conventional transistor and/or SET device. After the fabrication of the semiconductor product is complete, the wafer 450 may undergo a singulation process in which each of the dies 452 is separated from one another to provide discrete "chips" of the semiconductor product. A die 452 may include one or more SET devices 100, qubit-detector arrangements 674, and/or supporting circuitry to route electrical signals to the SET devices 100 and/or qubit-detector arrangements 674 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 38) or other logic that is configured to store information in the memory devices or execute instructions stored in the memory array.

FIG. 34 is a cross-sectional side view of a device assembly 400 that may include any of the embodiments of the SET devices 100 and/or qubit-detector arrangements 674 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 34 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure. As used herein, a package may include a die (e.g., a die 452) coupled to a package substrate; the package substrate may provide mechanical and/or electrical support to the die, and may take any form known in the art.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 34, multiple packages may be coupled to the interposer 404; indeed, additional interposers may be coupled to the interposer 404. The interposer 404 may provide an intervening substrate used to bridge the circuit board 402 and the package 420. The package 420 may include a SET device 100 and/or a qubit-detector arrangement 674, and/or may include conventional IC devices. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 34, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 420 may include a SET device 100 and/or a qubit-detector arrangement 674, and/or may include conventional IC devices.

The device assembly 400 illustrated in FIG. 34 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include a SET device 100 and/or a qubit-detector arrangement 674, and/or may include conventional IC devices.

As noted above, any suitable techniques may be used to manufacture the SET devices 100 disclosed herein. FIG. 35 is a flow diagram of an illustrative method 1000 of manufacturing a SET device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable SET device (including any suitable ones of the embodiments disclosed herein).

At 1002, a conductive material may be provided on a support. For example, conductive material 534 or 594 may be provided on the substrate 502 (e.g., as discussed above with reference to FIGS. 4-6, 15, and 20).

At 1004, an insulating material may be provided on the conductive material to form a first assembly. For example, an insulator 510 may be provided on the conductive material 534 or 594 (e.g., as discussed above with reference to FIGS. 7, 15, and 21).

At 1006, a first recess may be formed in the first assembly. The first recess may extend into the conductive material and may separate the conductive material into at least first and second separate conductive portions. For example, one or more recesses 536 may be formed (e.g., as discussed above with reference to FIGS. 8, 16, and 24).

At 1008, a dielectric may be provided on the sidewalls and bottom of the first recess. For example, the dielectric material 593 may be provided on the sidewalls and bottom of the one or more recesses 536 (e.g., as discussed above with reference to FIGS. 9 and 17).

At 1010, an island material may be provided in the first recess on the dielectric to form a second assembly. For example, the island material 538 may be provided in the one or more recesses 536 (e.g., as discussed above with reference to FIGS. 10, 18, and 29).

At 1012, a second recess may be formed in the second assembly. The second recess may extend into the second conductive portion. For example, one or more recesses 536 may be formed (e.g., as discussed above with reference to FIG. 30).

At 1014, additional dielectric may be provided on the sidewalls and bottom of the second recess. For example, the dielectric material 593 may be provided on the sidewalls and bottom of the one or more recesses 536 (e.g., as discussed above with reference to FIGS. 9, 17, and 30).

At 1016, additional island material may be provided in the second recess on the additional dielectric. For example, the island material 538 may be provided in the one or more recesses 536 (e.g., as discussed above with reference to FIGS. 10, 18, and 30).

A number of techniques are disclosed herein for operating a SET device 100. FIG. 36 is a flow diagram of a particular illustrative method 1020 of operating a qubit-detector arrangement, and FIG. 37 is a flow diagram of a particular illustrative method 1040 of operating a SET device, in accordance with various embodiments. Although the operations discussed below with reference to the methods 1020 and 1040 are illustrated in a particular order and depicted once each, these operations may be repeated or performed in a different order (e.g., in parallel), as suitable. Additionally, various operations may be omitted, as suitable. Various operations of the methods 1020 and 1040 may be illustrated with reference to one or more of the embodiments discussed above, but the methods 1020 and 1040 may be used to operate any suitable device (including any suitable ones of the embodiments disclosed herein).

Turning to FIG. 36, at 1022, electrical signals may be provided to a plurality of active qubit devices as part of causing quantum dots to form in the plurality of active qubit devices. Individual ones of the active qubit devices may include a SET having multiple islands. For example, electrical signals may be provided to the SETs 100 used as qubit devices 670 in a qubit-detector arrangement 674 (e.g., as discussed above with reference to FIGS. 31 and 32).

At 1024, quantum states of the quantum dots may be sensed with a plurality of quantum state detector devices. Individual ones of the quantum state detector devices may be associated with individual ones of the active qubit devices. For example, electrical signals may be provided to the SETs 100 used as detectors 672 in a qubit-detector arrangement 674 (e.g., as discussed above with reference to FIGS. 31 and 32).

Turning to FIG. 37, at 1042, a voltage may be controlled between a drain electrode and a source electrode of a SET device. For example, a voltage may be controlled between two S/D electrodes 504 of a SET device 100.

At 1044, a voltage may be controlled between a plurality of gate electrodes and an associated plurality of islands of a SET device. The SET device may take the form of any of the multi-island SET devices disclosed herein (e.g., discussed with reference to FIGS. 25-28 and 31-32). For example, a voltage may be controlled between a plurality of gate electrodes 506 and a corresponding plurality of islands 512 of a SET device 100.

Figure 38:
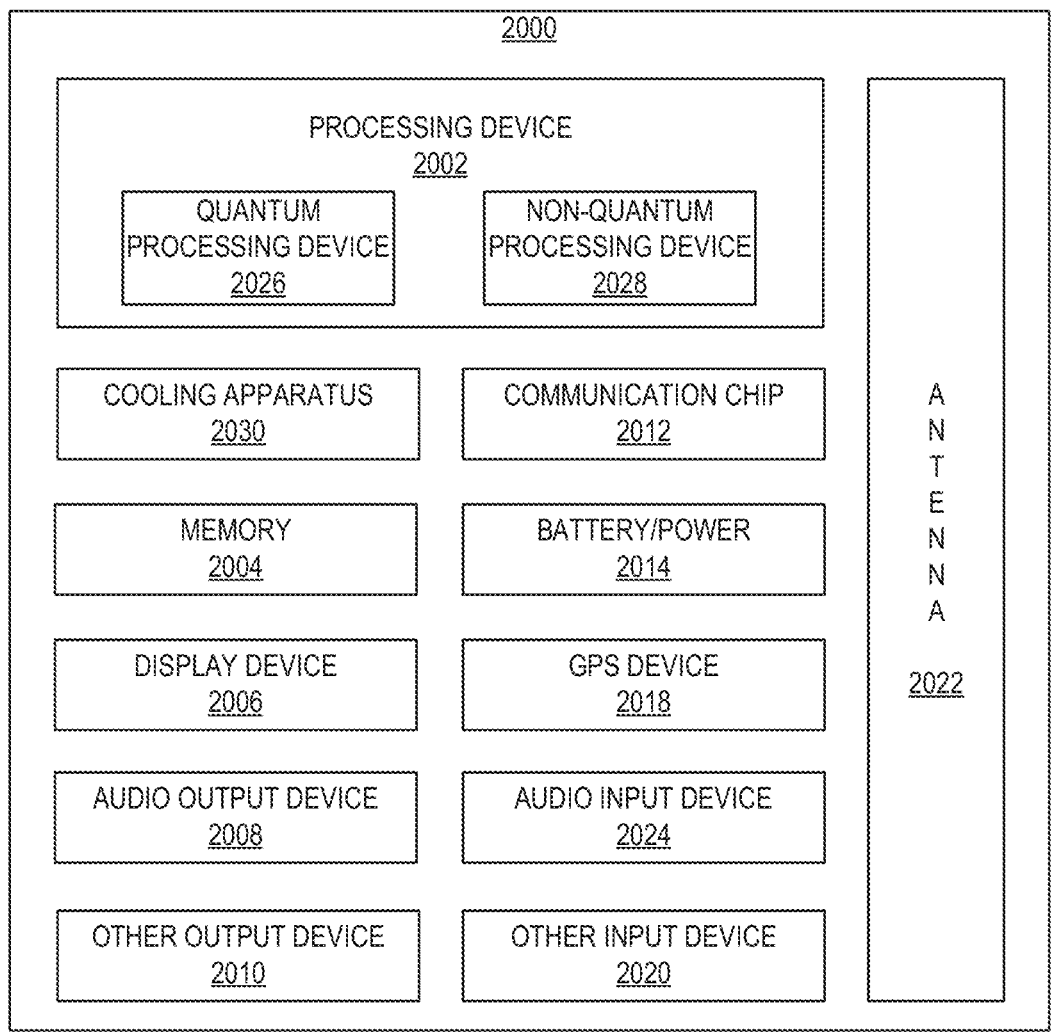
FIG. 38 is a block diagram of an example computing device that may include any of the SET devices and/or qubit-detector arrangements disclosed herein, in accordance with various embodiments.

FIG. 38 is a block diagram of an example computing device 2000 that may include any of the SET devices 100 and/or qubit-detector arrangements 674 disclosed herein. A number of components are illustrated in FIG. 38 as included in the computing device 2000, but any one or more of these components may be omitted or duplicated, as suitable for the application. In some embodiments, some or all of the components included in the computing device 2000 may be attached to one or more printed circuit boards (e.g., a motherboard). In some embodiments, various ones of these components may be fabricated onto a single system-on-a-chip (SoC) die. Additionally, in various embodiments, the computing device 2000 may not include one or more of the components illustrated in FIG. 38, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. In some embodiments, the processing device 2002 may include one or more SET devices 100 (in accordance with any of the embodiments disclosed herein), one or more conventional FETs or other transistors, or any desired combination of SET devices 100 and FETs (or other transistors).

In some embodiments, the processing device 2002 may include a quantum processing device 2026 (e.g., one or more quantum processing devices), and a non-quantum processing device 2028 (e.g., one or more non-quantum processing devices). The quantum processing device 2026 may include one or more qubit-detector arrangements 674, each including one or more qubit devices 670 (e.g., spin-based quantum dot devices) and one or more detectors 672 (in accordance with any of the embodiments disclosed herein) arranged to detect the state of the qubit devices 670. In some embodiments, the quantum processing device 2026 may perform data processing by performing operations on the qubit devices 670 that may be detected by the detectors 672, and may monitor the result of those operations. For example, different qubits may be allowed to interact, the quantum states of different qubits may be set or transformed, and the quantum states of qubits may be read (e.g., by a detector 672). In some embodiments, the qubit devices 670 themselves may be provided by SET devices 100, as discussed above. In some embodiments, the detectors 672 themselves may be provided by SET devices 100, as discussed above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. In some embodiments, the processing device 2002 may not include a quantum processing device 2026.

As noted above, the processing device 2002 may include a non-quantum processing device 2028. In some embodiments in which the processing device 2002 includes a quantum processing device 2026, the non-quantum processing device 2028 may provide peripheral logic to support the operation of the quantum processing device 2026. For example, the non-quantum processing device 2028 may control the performance of a read operation, control the performance of a write operation, control the clearing of qubits, etc. The non-quantum processing device 2028 may also perform conventional computing functions (e.g., to supplement the computing functions provided by the quantum processing device 2026). For example, the non-quantum processing device 2028 may interface with one or more of the other components of the computing device 2000 (e.g., the communication chip 2012 discussed below, the display device 2006 discussed below, etc.) in a conventional manner, and may serve as an interface between the quantum processing device 2026 and conventional components. In some embodiments in which the processing device 2002 does not include a quantum processing device 2026, the non-quantum processing device 2028 (which may include any of the SET devices 100 disclosed herein) may perform any known computing function. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

In some embodiments, the computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. The cooling apparatus 2030 may be, for example, a dilution refrigerator, a helium-3 refrigerator, or a liquid helium refrigerator. In some embodiments, the non-quantum processing device 2028 (and various other components of the computing device 2000) may not be cooled by the cooling apparatus 2030, and may instead operate at room temperature. For example, any of the SET devices 100 disclosed herein may be operated at liquid nitrogen temperature (approximately 77 degrees Kelvin). The SET devices 100 disclosed herein may be operated at or close to room temperature if the dimensions of the SET device 100 are suitable for operation in such temperature ranges. Operation of a SET device 100 at a particular temperature may be suitable, for example, when the charging energy of the SET device 100 is at least three times larger than the energy of the thermal bath in which the SET device 100 operates. In some embodiments, the computing device 2000 may not include a cooling apparatus 2030.

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a device, including: first and second source/drain (S/D) electrodes of a multi-island single electron transistor (SET); a plurality of islands of the multi-island SET, disposed between the first and second S/D electrodes; and dielectric material disposed between adjacent ones of the islands, between the first S/D electrode and an adjacent one of the islands, and between the second S/D electrode and an adjacent one of the islands.

Example 2 may include the subject matter of Example 1, and may further include first and second insulating supports, wherein the first S/D electrode is disposed on a side face of the first insulating support and the second S/D electrode is disposed on a side face of the second insulating support, and wherein the islands extend into an area between the first and second insulating supports.

Example 3 may include the subject matter of any of Examples 1-2, and may further specify that a height of at least one of the island is less than a height of the first S/D electrode.

Example 4 may include the subject matter of any of Examples 1-3, and may further specify that the dielectric material disposed between adjacent islands has a thickness between 0.5 and 5 nanometers.

Example 5 may include the subject matter of any of Examples 1-4, and may further specify that the first and second S/D electrodes are disposed on a substrate, and dielectric material is disposed between the substrate and the islands.

Example 6 may include the subject matter of any of Examples 1-5, and may further specify that the islands are a metal material.

Example 7 may include the subject matter of any of Examples 1-5, and may further specify that the islands are a semiconductor material.

Example 8 may include the subject matter of any of Examples 1-7, and may further include a plurality of gate electrodes spaced apart from, and associated with, respective ones of the plurality of islands.

Example 9 may include the subject matter of any of Examples 1-8, and may further specify that the multi-island SET is one of a plurality of multi-island SETs included in a corresponding plurality of qubit devices of the device.

Example 10 may include the subject matter of Example 9, and may further include a plurality of quantum state detector devices, wherein individual ones of the quantum state detector devices are associated with and disposed proximate to individual ones of the qubit devices.

Example 11 may include the subject matter of Example 10, and may further specify that individual ones of the quantum state detector devices include a SET.

Example 12 may include the subject matter of Example 11, and may further specify that the SET included in a quantum state detector device has a single island.

Example 13 may include the subject matter of Example 12, and may further specify that individual multi-island SETs have two islands.

Example 14 may include the subject matter of Example 12, and may further specify that individual multi-island SETs have three islands.

Example 15 may include the subject matter of any of Examples 10-14, and may further specify that individual multi-island SETs include a plurality of gate electrodes spaced apart from, and associated with, respective ones of the plurality of islands.

Example 16 may include the subject matter of Example 15, and may further specify that the plurality of islands of an individual multi-island SET is disposed between the plurality of gate electrodes of the individual multi-island SET and the quantum state detector device associated with the individual multi-island SET.

Example 17 may include the subject matter of Example 16, and may further specify that individual quantum state detector devices include a SET, the SET includes a gate electrode and an island, and the island is disposed between the gate electrode and the qubit device associated with the individual quantum state detector device.

Example 18 is a method of manufacturing a single electron transistor (SET) device, including: providing a conductive material on a support; providing an insulating material on the conductive material to form a first assembly; forming a first recess in the first assembly, wherein the first recess extends into the conductive material and separates the conductive material into at least first and second separate conductive portions; providing a dielectric on sidewalls and bottom of the first recess; providing an island material in the first recess on the dielectric to form a second assembly; forming a second recess in the second assembly, wherein the second recess extends into the second conductive portion; providing additional dielectric on sidewalls and bottom of the second recess; and providing additional island material in the second recess on the additional dielectric.

Example 19 may include the subject matter of Example 18, and may further specify that the first recess extends laterally beyond the conductive material.

Example 20 may include the subject matter of any of Examples 18-19, and may further specify that the island material is a semiconductor.

Example 21 may include the subject matter of any of Examples 18-19, and may further specify that the island material is a metal.

Example 22 may include the subject matter of any of Examples 18-21, and may further specify that forming the second recess in the second assembly includes removing at least some of the dielectric.

Example 23 may include the subject matter of any of Examples 18-22, and may further specify that the support has a surface on which the conductive material is provided, and the support includes a SET spaced away from the surface by insulating material.

Example 24 is a method of operating a single electron transistor (SET), including: controlling a voltage between a drain electrode and a source electrode of the SET; and controlling a voltage between a plurality of gate electrodes and respective ones of a plurality of islands of the SET; wherein the SET includes dielectric material disposed between adjacent ones of the islands, between the source electrode and an adjacent one of the islands, and between the drain electrode and an adjacent one of the islands.

Example 25 may include the subject matter of Example 24, and may further include adjusting the voltages on the plurality of gate electrodes of the SET to change a flow rate of single electrons through the SET.

Example 26 may include the subject matter of any of Examples 24-25, and may further include adjusting the voltages on the plurality of gate electrodes, the source electrode, and the drain electrode to confine single electrons in each of the islands of the SET.

Example 27 may include the subject matter of Example 26, and may further specify that the SET is a first SET, and the method further includes using a second SET to detect spin states of the electrons confined in the islands of the first SET.

Example 28 is a method of operating a quantum computing device, including: providing electrical signals to a plurality of active qubit devices as part of causing quantum dots to form in the plurality of the active qubit devices, wherein individual ones of the active qubit devices include a single electron transistor (SET) having multiple islands; and sensing quantum states of the quantum dots with a plurality of quantum state detector devices, wherein individual ones of the quantum state detector devices are associated with individual ones of the active qubit devices.

Example 29 may include the subject matter of Example 28, and may further specify that individual ones of the quantum state detector devices include a SET.

Example 30 may include the subject matter of Example 29, and may further include biasing the SETs of the quantum state detector devices before sensing the quantum states of the quantum dots.

Example 31 may include the subject matter of any of Examples 28-30, and may further specify that the multiple islands of an active qubit device are disposed between corresponding multiple gate electrodes and the quantum state detector device associated with the active qubit device.

Example 32 may include the subject matter of Example 31, and may further specify that individual ones of the quantum state detector devices include a SET having an island and a gate electrode, and the island of a quantum state detector device is disposed between the gate electrode of the quantum state detector device and the multiple islands of the active qubit device associated with the quantum state detector device.

Example 33 is a quantum computing device, including: a quantum processing device, wherein the quantum processing device includes a plurality of active qubit single electron transistors (SETs) proximate to a corresponding plurality of read SETs; a non-quantum processing device, coupled to the quantum processing device, to control electrical signals applied to the active qubit SETs to cause the active qubit SETs to generate quantum dots, wherein quantum states of the quantum dots are detectable by the read SETs; and a memory device to store data generated by the read SETs during operation of the quantum processing device.

Example 34 may include the subject matter of Example 33, and may further include a communication chip communicatively coupled to the non-quantum processing device.

Example 35 may include the subject matter of any of Examples 33-34, and may further specify that individual active qubit SETs are spaced apart from their associated read SET by a distance that is less than 200 nanometers.

Example 36 may include the subject matter of any of Examples 33-35, and may further specify that individual active qubit SETs are spaced apart from their associated read SET by a distance that is between 50 nanometers and 150 nanometers.

Example 37 may include the subject matter of any of Examples 33-36, and may further include a cooling apparatus.

The invention claimed is:

1. A device, comprising:
a source electrode and a drain electrode of a first single electron transistor (SET);
a first island between the source electrode and the drain electrode of the first SET;
a first gate electrode spaced apart from the first island;
a source electrode and a drain electrode of a second SET;
a second island between the source electrode and the drain electrode of the second SET; and
a second gate electrode spaced apart from the second island,
wherein the second gate electrode is closer to the first island than to the second island.

2. The device of claim 1, wherein the first gate electrode is closer to the first island than to the second island.

3. The device of claim 1, wherein at least a portion of the first island is between at least a portion of the second island and at least a portion of the first gate electrode.

4. The device of claim 1, wherein at least a portion of the first gate electrode is between at least a portion of the first island and at least a portion of the second gate electrode.

5. The device of claim 1, further comprising:
a support structure having a first face and a second face, the second face being opposite the first face,
wherein the first gate electrode is on the first face and the second gate electrode is on the second face.

6. The device of claim 5, wherein the first face is closer to each of the first island and the second island than the second face.

7. The device of claim 5, wherein at least a portion of the first island is between at least a portion of the second island and at least a portion of the first face.

8. The device of claim 1, further comprising a dielectric, the dielectric having:
a first portion between the source electrode of the first SET and the first island, and
a second portion between the drain electrode of the first SET and the first island.

9. The device of claim 8, wherein the first portion and the second portion are materially continuous portions of the dielectric.

10. The device of claim 1, wherein:
the device is a quantum computing device, the quantum computing device comprising a quantum processing device and a non-quantum processing device, coupled to the quantum processing device,
the quantum processing device includes the source electrode and the drain electrode of the first SET, the first island, the first gate electrode, the source electrode and the drain electrode of the second SET, the second island, and the second gate electrode, and
the non-quantum processing device is to control electrical signals applied to the first SET and the second SET.

11. The device of claim 10, wherein the quantum computing device further includes a memory device to store data generated during operation of the quantum processing device.

12. A device, comprising:
a source electrode and a drain electrode of a first single electron transistor (SET);
a first island between the source electrode and the drain electrode of the first SET;
a first gate electrode spaced apart from the first island;
a source electrode and a drain electrode of a second SET;
a second island between the source electrode and the drain electrode of the second SET; and
a second gate electrode spaced apart from the second island,
wherein at least a portion of the first gate electrode is between at least a portion of the first island and at least a portion of the second gate electrode.

13. The device of claim 12, further comprising a dielectric surrounding sidewalls of the first island.

14. The device of claim 13, wherein, in a cross-sectional side view, the dielectric is a U-shaped dielectric.

15. The device of claim 12, further comprising a dielectric, the dielectric having:
a first portion between the source electrode of the first SET and the first island, and
a second portion between the drain electrode of the first SET and the first island.

16. The device of claim 15, wherein the first portion and the second portion are materially continuous portions of the dielectric.

17. The device of claim 12, wherein at least a portion of the first island is between at least a portion of the second island and at least a portion of the first gate electrode.

18. The device of claim 12, further comprising a gate support, wherein the first gate electrode and the second gate electrode are on opposite sidewalls of the gate support.

19. A device, comprising:
a source electrode and a drain electrode of a first single electron transistor (SET);
a first island between the source electrode and the drain electrode of the first SET;
a first gate electrode spaced apart from the first island;
a source electrode and a drain electrode of a second SET;
a second island between the source electrode and the drain electrode of the second SET;
a second gate electrode spaced apart from the second island; and
a gate support, wherein the first gate electrode and the second gate electrode are on opposite sidewalls of the gate support.

20. The device of claim 19, wherein the first island is between the gate support and at least a portion of the second island.

* * * * *